United States Patent
Wu

(10) Patent No.: US 11,491,648 B2
(45) Date of Patent: Nov. 8, 2022

(54) ROBOTIC SYSTEMS AND CORRESPONDING METHODS FOR ENGAGING SERVER BACK-PLANE CONNECTORS

(71) Applicant: Synopsys, Inc., Mountain View, CA (US)

(72) Inventor: Chih I. Wu, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 407 days.

(21) Appl. No.: 16/742,592

(22) Filed: Jan. 14, 2020

(65) Prior Publication Data

US 2020/0223060 A1  Jul. 16, 2020

Related U.S. Application Data

(60) Provisional application No. 62/792,173, filed on Jan. 14, 2019.

(51) Int. Cl.
*H02K 41/02* (2006.01)
*B25J 9/12* (2006.01)
*H05K 7/14* (2006.01)

(52) U.S. Cl.
CPC .......... *B25J 9/123* (2013.01); *H05K 7/1487* (2013.01); *H05K 7/1489* (2013.01)

(58) Field of Classification Search
CPC ..... B25J 9/123; H05K 7/1487; H05K 7/1489; G06F 1/186
USPC ....................................................... 310/12.01
See application file for complete search history.

(56) References Cited

U.S. PATENT DOCUMENTS

| | | | |
|---|---|---|---|
| 8,132,874 B2 | 3/2012 | Ong et al. | |
| 9,788,451 B2 | 10/2017 | Bailey et al. | |
| 11,310,569 B2* | 4/2022 | Menard | H04Q 11/0005 |
| 2008/0232057 A1 | 9/2008 | Desrosiers et al. | |
| 2009/0257186 A1 | 10/2009 | Dunham et al. | |

(Continued)

FOREIGN PATENT DOCUMENTS

| | | |
|---|---|---|
| JP | 2018185832 A | 11/2018 |
| JP | 6442066 B2 | 12/2018 |

OTHER PUBLICATIONS

PCT/US2020/013473 International Search Report and Written Opinion dated Apr. 28, 2020.

*Primary Examiner* — Don N Vo
(74) *Attorney, Agent, or Firm* — Weaver Austin Villeneuve & Sampson LLP

(57) ABSTRACT

A linear motion actuation system and method of using the same may be utilized for installing or removing a server blade within a server rack, via a linear motion assembly fastened to a server blade and configured for linear motion with the server blade; a bracket fastened to a server rack; and at least one linear motion actuator comprising: a first component secured with the linear motion assembly; and a second component movably secured with the first component and secured with the bracket. The second component is configured for at least substantially linear movement relative to first component, and the at least one linear motion actuator is configured to, upon receipt of a signal from a controller, move the second component in an at least substantially linear direction relative to the first component to move the server blade relative to the server rack.

20 Claims, 17 Drawing Sheets

(56) References Cited

U.S. PATENT DOCUMENTS

| | | | |
|---|---|---|---|
| 2011/0171848 A1* | 7/2011 | Duesterhoeft | H05K 7/1439 439/329 |
| 2018/0024739 A1 | 1/2018 | Schmisseur | |
| 2019/0289748 A1 | 9/2019 | Saito | |

* cited by examiner

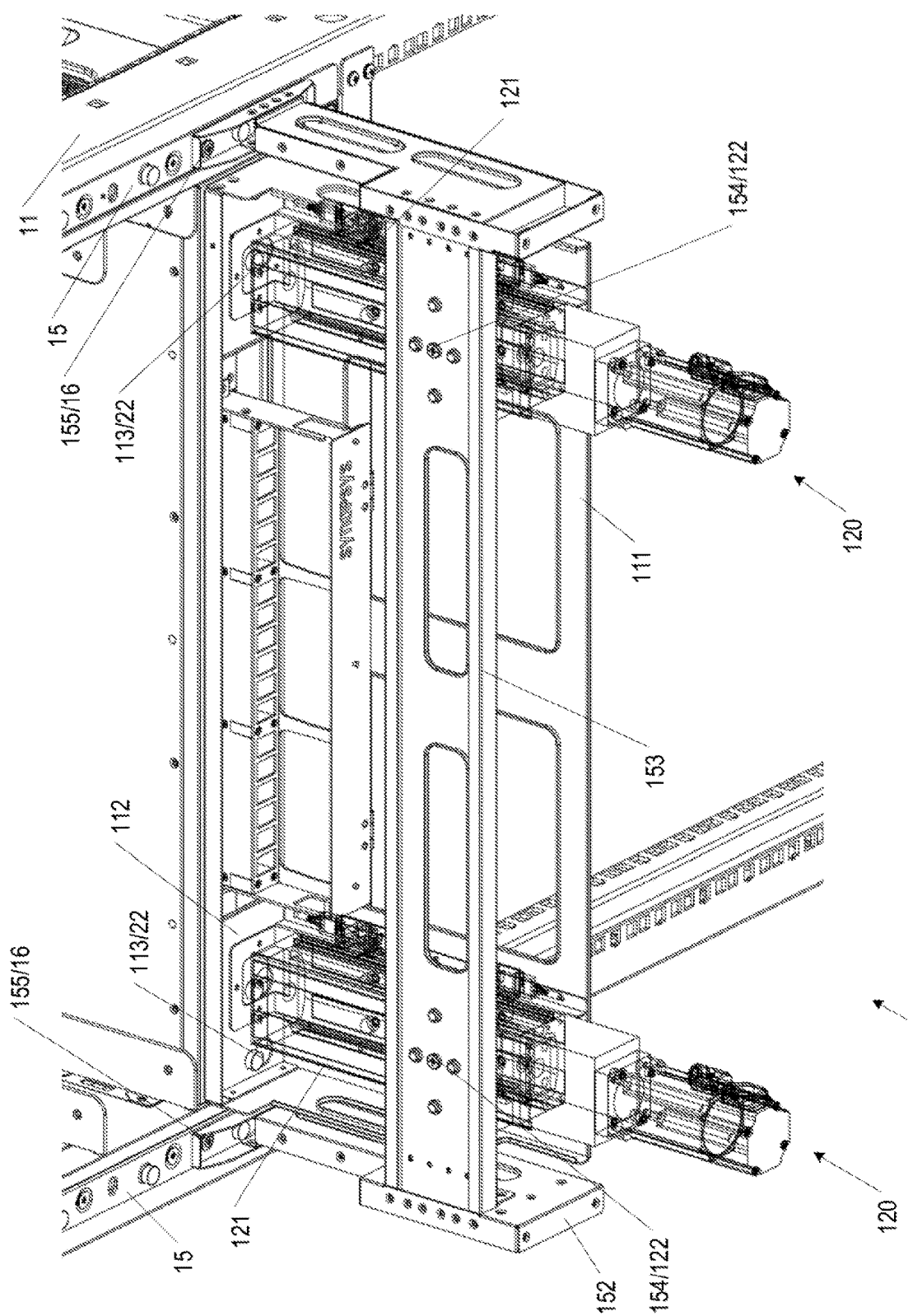

ROBOTIC SYSTEMS AND CORRESPONDING METHODS FOR ENGAGING SERVER BACK-PLANE CONNECTORS

CROSS-REFERENCE TO RELATED APPLICATIONS

This patent application claims priority to U.S. Provisional Patent Appl. Ser. No. 62/792,173 filed Jan. 14, 2019, the contents of which are incorporated herein by reference in their entirety.

FIELD

Certain embodiments relate to the field of assembly of server systems, specifically utilizing mechanized robotic systems for assembling server systems.

BACKGROUND

As data-center server design has increasing back-plane connector density (with more and more back-plane connectors involved) the problem of reliably engaging and disengaging back-plane connectors has grown significantly. Complex modules with thousands of pins require exceptional force (several hundreds of pounds of force) to engage all of the connectors at least substantially simultaneously and/or to disengage all of the connectors at least substantially simultaneously. Due to the at least substantially rigid nature of the server devices (e.g., blades, and/or the like), the backplane connectors are required to be connected at least substantially simultaneously, with high level of precision due to the fragile nature of the conductive aspects within each of the plurality of backplane connectors. Human-applied force alone is no longer a practical option to supply the level of force required to connect the plurality of backplane connectors of many server devices.

Another approach is to supply force for back-plane connector engagement/disengagement via a lever-arm design. These lever arms may decrease the amount of force that a human is required to apply due to the mechanical advantage provided by the lever arm. The mechanical advantage of the lever arm is the ratio of output force to input force, so a lever arm can decrease the force requirement from human hands by incorporating a longer lever arm. Thus, as the force requirement of back-plane connector engagement/disengagement continues to increase, increasingly long lever arms are required to maintain a reasonable human force input requirement for engagement/disengagement of backplane connectors. However, long length lever arms are highly impractical, as their bulk and size may limit the ability to efficiently utilize space around and/or within server cabinets.

Furthermore, using human-applied force via lever arms to engage a long row of back-plane connectors generally results in imperfect synchronization between left and right-side lever arms, which results in imperfect force and alignment to engage backplane connectors. The motion/force supplied from a human's left and right hands are naturally not synchronized, not aligned and not consistent. Differences in motion/force applied via left and right-side lever arms results in skewing of the server blade during installation, causing the server blade back plane connector pins to be skewed relative to corresponding connectors during engagement. This increases the chances of bending pins during installation, and just one bent pin can render an entire system including the server blade not functional fundamentally. Such inconsistencies between left and right side levers becomes more unpredictable when the lever arms are operated by different people, since the force patterns of human left and right hands are essentially different from one person to another.

Due at least in part to the requirement of highly precise alignment and high levels of force when engaging and disengaging backplane connectors of modern server devices, a need exists for mechanisms facilitating installation and disengagement of servers with corresponding backplane connectors while minimizing the likelihood of damage to connector pins and sockets of the backplane connectors.

BRIEF SUMMARY

An electromechanical tool is provided for automated insertion and removal operations for rack-mounted modules. Specifically, this tool aligns the module connectors to the back-plane connectors, applies a controlled amount of force, velocity, and travel distance to engage and to disengage the back-plane connectors, and maintains connector alignment through the entire insertion and removal operations.

Various embodiments are directed to a linear motion actuation system for moving a server blade within a server rack, the system comprising: a controller; a linear motion assembly configured for fastening relative to a server blade and configured for linear motion with the server blade; a bracket configured for fastening relative to a server rack; and at least one linear motion actuator comprising: a first component secured with the linear motion assembly; and a second component movably secured with the first component and secured with the bracket, wherein the second component is configured for at least substantially linear movement relative to first component; wherein the at least one linear motion actuator is configured to, upon receipt of a signal from the controller, move the second component in an at least substantially linear direction relative to the first component to move the server blade relative to the server rack.

In certain embodiments, the first component of the at least one linear motion actuator is embodied as a linear motion motor. Moreover, in certain embodiments, the second component of the at least one linear motion actuator is embodied as a movement saddle rigidly secured with the bracket. In various embodiments, the linear motion assembly is configured to engage at least one fastener to rigidly secure the linear motion assembly relative to the server blade. Moreover, in certain embodiments, the linear motion assembly is configured to engage at least one fastener to rigidly secure the linear motion assembly relative to a front face of the server blade. In various embodiments, the at least one fastener comprises a T-head pin configured for slidable engagement with a keyhole within a surface of the linear motion assembly. In accordance with certain embodiments, the bracket is configured to engage at least one fastener to rigidly secure the bracket relative to the server rack. In certain embodiments, the at least one fastener comprises a T-head pin configured for slidable engagement with a keyhole within a surface of the bracket. Moreover, in various embodiments, the at least one linear motion actuation comprises at least two linear motion actuators. In certain embodiments, the controller is configured to monitor feedback indicative of a position of each of the at least two linear motion actuators to maintain at least substantially parallel and equal travel distance. In certain embodiments, the controller stores a maximum off-sync range, and wherein the controller is configured to generate a signal to stop motion of the at least two linear motion actuators upon detecting the position of each of the at least two linear motion actuators results in a position difference exceeding the maximum off-sync range. Moreover, in various embodiments, the controller is configured to: generate a first signal to move the second component in a first at least substantially linear direction relative to the first component; and generate a second signal to move the second component in a second at least substantially linear direction relative to the first component, wherein the second direction is at least substantially opposite the first direction. In various embodiments, the second component is configured to be fastened relative to the bracket via one or more screws.

Certain embodiments are directed to a method for moving a server blade within a server rack, the method comprising: securing a linear motion assembly relative to a server blade, wherein the linear motion assembly is configured for linear motion with the server blade, and wherein the linear motion assembly is secured relative to at least one linear motion actuator comprising a first component rigidly secured relative to the linear motion assembly and a second component moveably secured with the first component and configured for at least substantially linear movement relative to the first component; securing a bracket relative to a server rack; rigidly securing the bracket relative to the second component of the at least one linear motion actuator; and transmitting a signal from a controller to the linear motion actuator to cause the second component to move at least substantially linearly relative to the first component and to move the server blade relative to the server rack.

In various embodiments, securing a linear motion assembly relative to a server blade comprises securing a linear motion assembly relative to a front face of the server blade. Moreover, in certain embodiments, the linear motion actuator comprise the first component embodied as a linear motion actuator housing and the second component embodied as a movement saddle moveable relative to the linear motion actuator housing, and wherein rigidly securing the bracket relative to the second component comprises fastening the bracket relative to the movement saddle. In certain embodiments, the at least one linear motion actuator comprises at least two linear motion actuators, and wherein securing the bracket relative to the second component of the at least one linear motion actuator comprises securing the bracket relative to each of the at least two linear motion actuators. In certain embodiments, the method further comprises monitoring, via the controller, feedback indicative of a position of each of the at least two linear motion actuators to maintain at least substantially parallel and equal travel distance.

In various embodiments, the method further comprises storing, via the controller, a maximum off-sync range; and generating a signal to stop motion of the at least two linear motion actuators upon detecting the position of each of the at least two linear motion actuators results in a position difference exceeding the maximum off-sync range. In certain embodiments, the method further comprises generating, via the controller, a first signal to move the second component in a first at least substantially linear direction relative to the first component; and generating, via the controller, a second signal to move the second component in a second at least substantially linear direction relative to the first component, wherein the second direction is at least substantially opposite the first direction.

BRIEF DESCRIPTION OF THE SEVERAL VIEWS OF THE DRAWINGS

Reference will now be made to the accompanying drawings, which are not necessarily drawn to scale, and wherein:

FIGS. 9-12B illustrate various steps associated with installing a linear motion actuation system relative to a server blade and server rack according to one embodiment.

DETAILED DESCRIPTION

Figure 1:
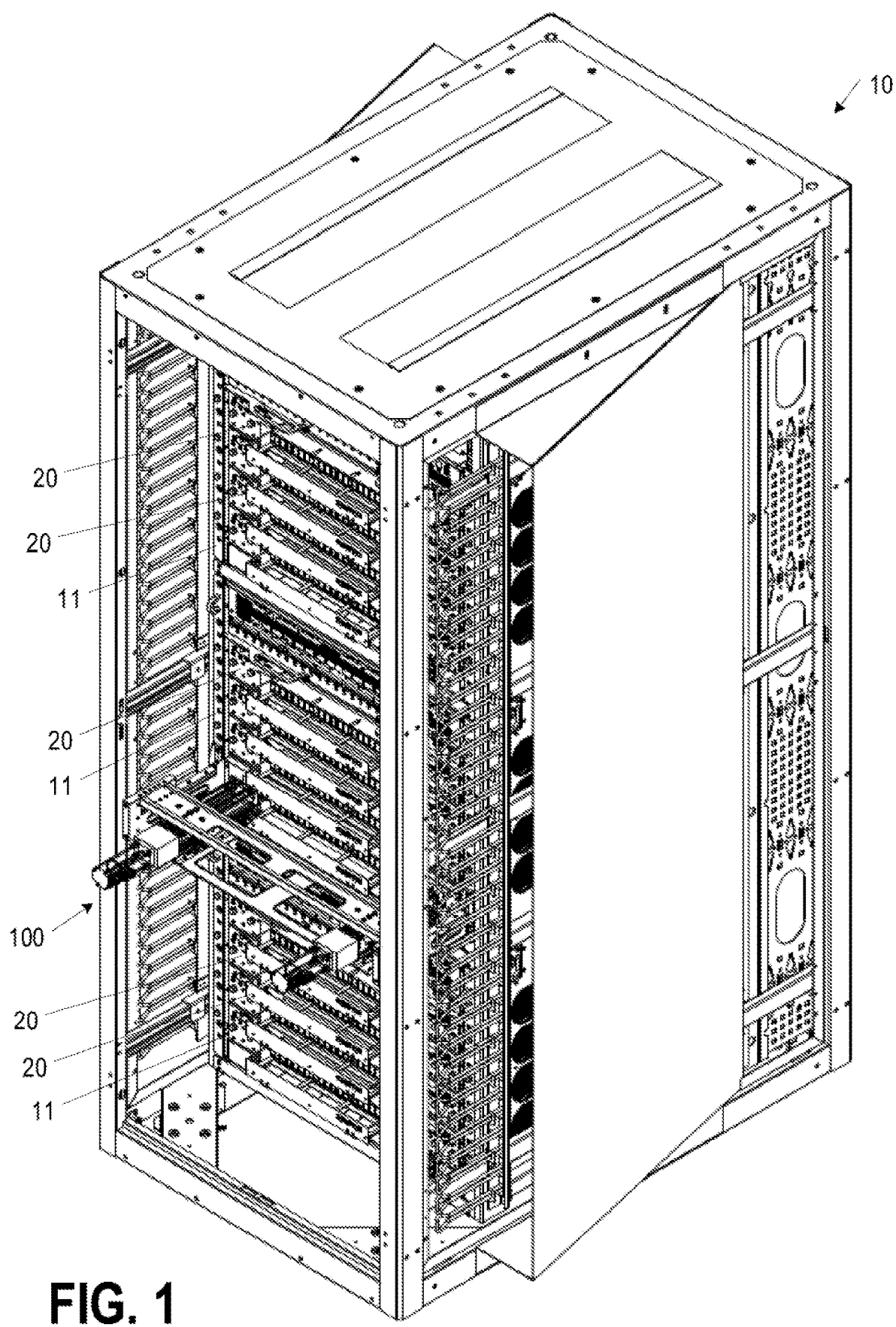
FIG. 1 illustrates a server cabinet having a plurality of server racks therein, a plurality of server blades installed within respective slots of the server racks, and a linear motion actuation system coupled relative to one server blade.

The present disclosure more fully describes various embodiments with reference to the accompanying drawings. It should be understood that some, but not all embodiments are shown and described herein. Indeed, the embodiments may take many different forms, and accordingly this disclosure should not be construed as limited to the embodiments set forth herein. Rather, these embodiments are provided so that this disclosure will satisfy applicable legal requirements. Like numbers refer to like elements throughout.

Overview

Various embodiments are directed to an electromechanical tool embodied as a linear motion actuation system configured for moving server blades relative to server racks, for example during server installation and/or removal processes. As server blades require engagement of an ever-increasing number of back-plane connector pins between a back-surface of the server blade and a connection plate associated with the server rack (e.g., a bus), the amount of force required to simultaneously engage/disengage server blades from back-plane connectors is constantly increasing. In order to provide sufficiently high engagement/disengagement forces to a server blade during installation or removal processes, while maintaining sufficiently high degrees of precision in moving the server blade into/out of engagement with corresponding back plane connectors, the linear motion actuation system of various embodiments is configured to provide a high degree of installation/removal forces while maintaining high degrees of precision in moving the server blade in an at least substantially linear direction relative to the server rack, without skewing the server blade within the server rack, so as to ensure highly precise engagement between the back-plane connectors and corresponding pins of a server blade.

As a non-limiting example, an example server blade may include pins to engage 31 back-plane connectors associated with a blade slot of a server rack, with each connector embodied as a 6-pin by 8-pin signal connector array (plus an additional non-signal connector array). Accordingly, in such an embodiment, a total of 4636 pins must be connected at least substantially simultaneously, and with a high degree of precision to avoid damage to any of the pins/connectors when installing the server blade. If each pin/connector is assumed to require at least approximately 0.076 lbf to engage the pin into a corresponding connector, the overall server blade requires at least approximately 352 lbf to simultaneously engage all of the 4636 pins into corresponding connectors. Including frictional forces arising during the linear movement of a server blade relative to a server rack, an example server blade may require a total of at least approximately 365 lbf to install the server blade within a server rack. This level of force is drastically higher than an average human is expected to be able to apply, particularly in the space-limited environment often associated with installing a server blade within a server rack.

Server Cabinet, Rack, and Server Blade Configurations

FIG. 1 illustrates an example server cabinet 10 within which a plurality of server racks 11 are installed. The server cabinet 10 may define a housing defining an access opening, for example, spanning at least substantially an entire side (e.g., a front side) of the server cabinet 10. Although not shown, the server cabinet 10 may comprise a plurality of server rack mounting configurations for securely and at least substantially rigidly securing each of a plurality of server racks 11 therein. In the illustrated embodiment of FIG. 1, for example, the server cabinet 10 may be configured to securely support three server racks 11 therein.

Figure 2A:
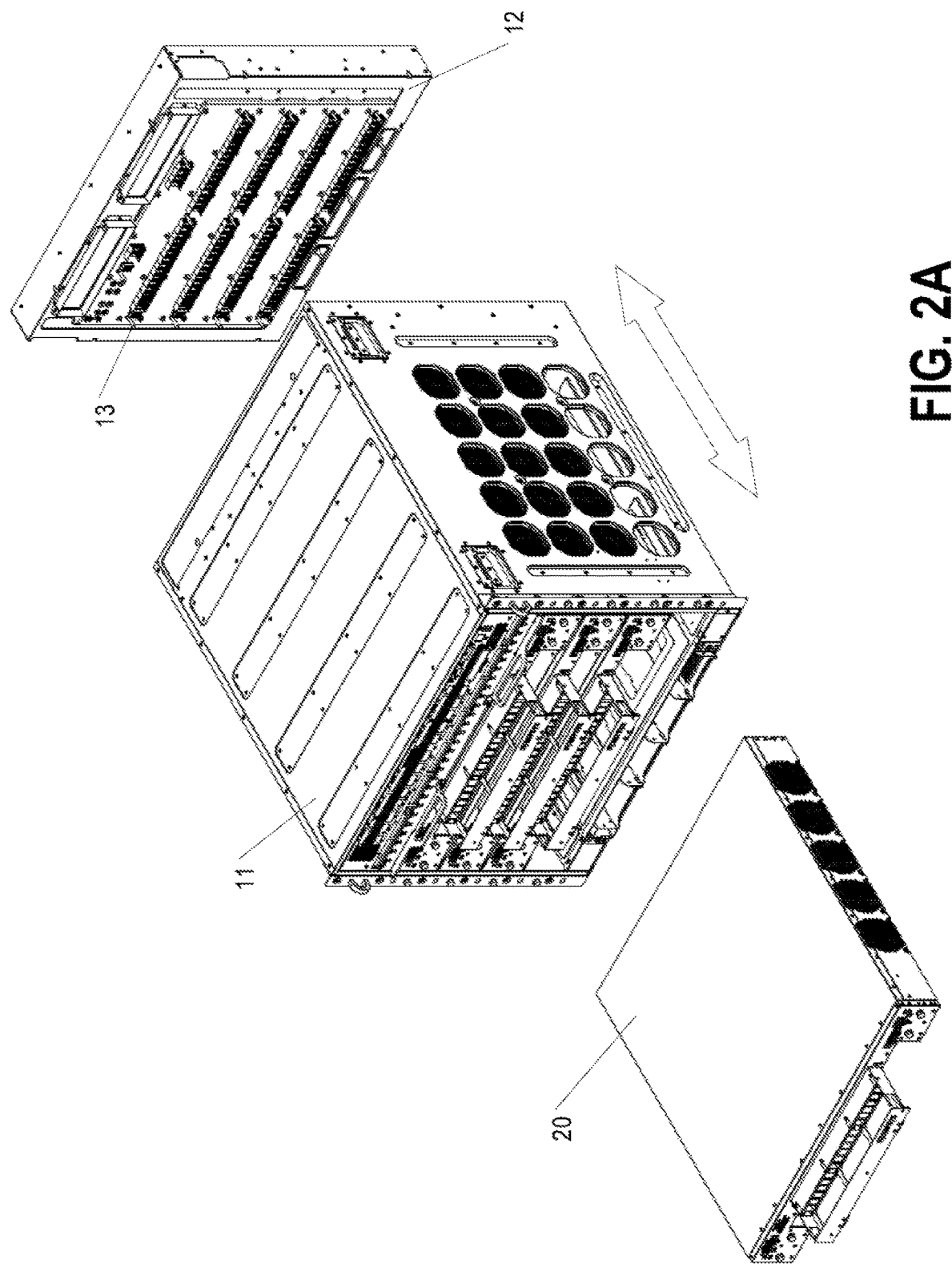
FIGS. 2A-B illustrate the assembly of a server rack in accordance with various embodiments.
Figure 2B:
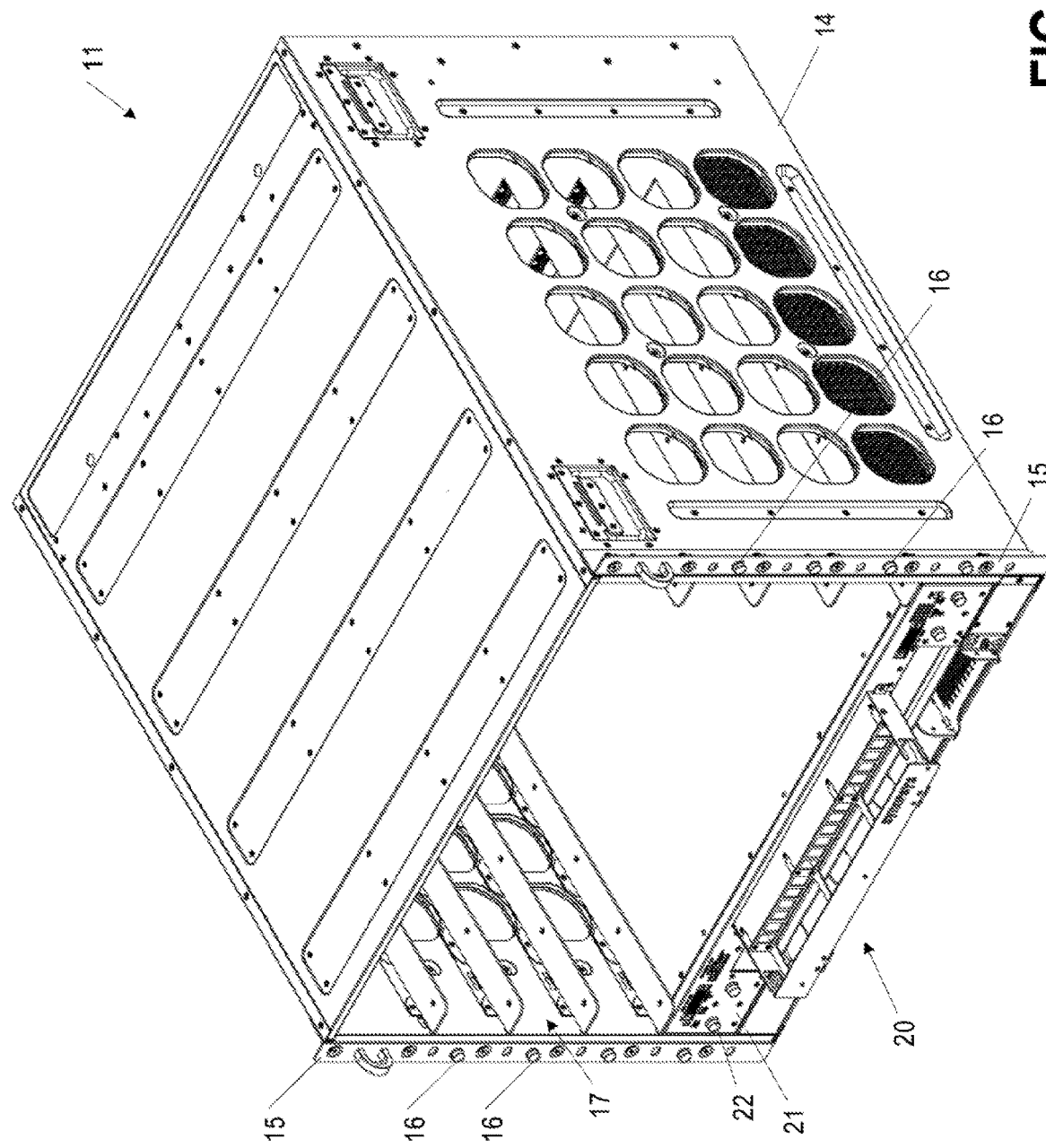

With reference to FIGS. 2A-2B, which illustrate various components of a server rack 11 according to certain example configurations, the server rack 11 may define a rack housing 14 defining a plurality of blade slots 17 therein (e.g., four blade slots as shown in the illustrated embodiment). Each blade slot 17 may be configured to support a single server blade therein. Each blade slot may be defined within the housing, and may have an open front end, slot dividers configured for supporting a server blade 20 therein. Moreover, the rack housing 14 may be associated with a back plane 12 having a plurality of connector arrays 13 thereon. The back plane 12 may comprise one or more connector arrays 13 corresponding to each blade slot 17, wherein each connector array 13 is configured to provide electrical and signal connectivity to a corresponding server blade 20 installed in the blade slot 17. Moreover, the connector arrays 13 of certain embodiments comprise alignment features (e.g., alignment pins) to ensure that the connectors are being appropriately engaged by the pin arrays of a server blade 20. In certain embodiments, the back plane 12 may be embodied as or may comprise a circuit board (e.g., a printed circuit board) operating as a bus providing connectivity between server blades 20 installed within the server rack 11 and/or with additional server blades 20 installed in other server racks (e.g., within the same server cabinet 10 and/or additional server cabinets).

As also shown in the example embodiment of FIGS. 2A-2B, the rack housing 14 may define installation flanges 15 at least substantially aligned with a front surface of the rack housing 14 and positioned on opposing sides of the rack housing 14. The installation flanges 15 may each be at least substantially perpendicular to the blade slots 17 (e.g., if the blade slots 17 are at least substantially horizontal, and configured to support server blades 20 installed in horizontal orientations, then the installation flanges 15 may extend at least substantially vertically, along opposite sides of the open front end of the rack housing 14), such that the installation flanges 15 extend adjacent each of the blade slots 17 of the rack housing 14.

Moreover, as shown, the installation flanges 15 comprise bracket mounting fastener portions (such as the T-head pins 16 in the illustrated embodiments) configured to engage corresponding bracket mounting fastener portions of a bracket 150 of a linear motion actuation system 100 as discussed herein. It should be understood that any of a variety of fasteners may be utilized for securing a bracket 150 relative to the installation flanges 15 of the server rack 11 (e.g., screws, bolts, pins, keyhole-and-T-head pins, and/or the like), and accordingly the bracket mounting fastener portions may be configured in accordance with a desired fastener configuration for use.

As illustrated in FIG. 2A specifically, the various illustrated components, including the rack housing 14, the back plane 12, and the server blade 20 are installed relative to one another (e.g., to form the installed configuration shown in FIG. 2B).

As additionally illustrated in FIGS. 2A-2B, server blades 20 in accordance with certain embodiments are embodied as a housing having a front face 21 and an opposing rear surface. Although not shown, the rear surface defines a pin array comprising a plurality of connector pins each configured to engage a corresponding connector of the connector array 13 of the back plane 12. The front face 21 may be at least substantially planar in certain embodiments, with one or more features, connectors, user interface elements, and/or the like provided thereon. It should be understood that the front face 21 of a server blade 20 may have any of a variety of configurations defining contours of the front face 21 of the server blade 20, and the linear motion actuation system 100 as discussed herein may be configured to accommodate any of a variety of configurations of a front face 21 of a server blade 20. In the illustrated embodiment, the front face 21 defines at least a plurality of planar portions and one or more fastener engagement features which may be utilized to secure the linear motion assembly 110 discussed herein relative to the server blade 20. Specifically with respect to the illustrated embodiments, the fastener engagement features of the server blade 20 is embodied as T-head pins 22 configured to engage corresponding keyhole slots 113 of the linear motion assembly 110. However, it should be understood that any of a variety of fasteners may be utilized for securing a linear motion assembly 110 relative to a server blade 20, and accordingly the fastener engagement features of the server blade 20 may be configured to accommodate a desired fastener type. For example, the fastener engagement features of the server blade 20 may be embodied as male threaded pins to accommodate nut-style fasteners, female threaded pins to accommodate bolt-style fasteners, keyhole slots to accommodate T-head pin style fasteners of a linear motion assembly 110, and/or the like.

Linear Motion Actuation System

As discussed herein, the linear motion actuation system 100 is configured to move a server blade 20 at least substantially linearly, with minimal skewing, relative to a server rack 11, specifically, to move the server blade 20 within a blade slot 17 to engage/disengage pins of the server blade 20 with corresponding connector arrays 13 disposed on a back plane 12 during installation or removal processes. Because the travel path length required to install the server blade 20 within a blade slot 17 is minimal, with the installation force required only increasing during engagement of the pins of the server blade 20 with corresponding connector arrays 13, the linear motion actuation system 100 may be configured specifically for a small linear motion travel path length (e.g., 5 mm, 10 mm, 15 mm, 20 mm, 40 mm, and/or the like), while the remaining linear motion path of the server blade 20 into/out of the blade slot 17 may be performed manually. However it should be understood that the amount of linear motion provided by the linear motion actuation system 100 may be adjusted to accommodate installation/removal requirements of specific server blades 20. Moreover, it should be understood that while the illustrations and discussed configurations explicitly discuss installation server blades 20 in a horizontal orientation, analogous configurations of a linear motion actuation system 100 may be utilized for installing server blades 20 in any of a variety of orientations, such as vertical orientations.

Figure 3:
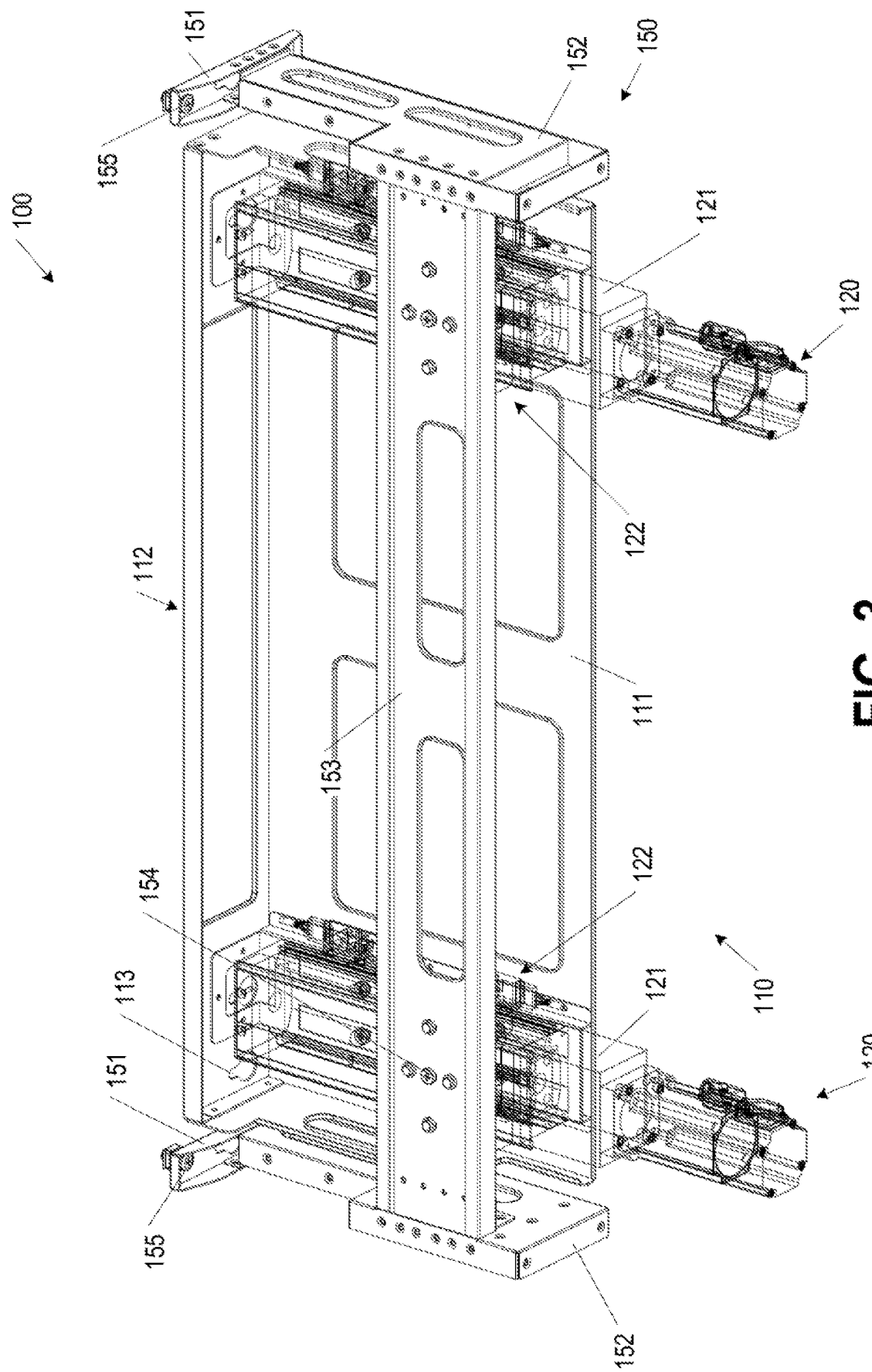
FIG. 3 illustrates an assembled linear motion actuation system according to one embodiment.
Figure 4:
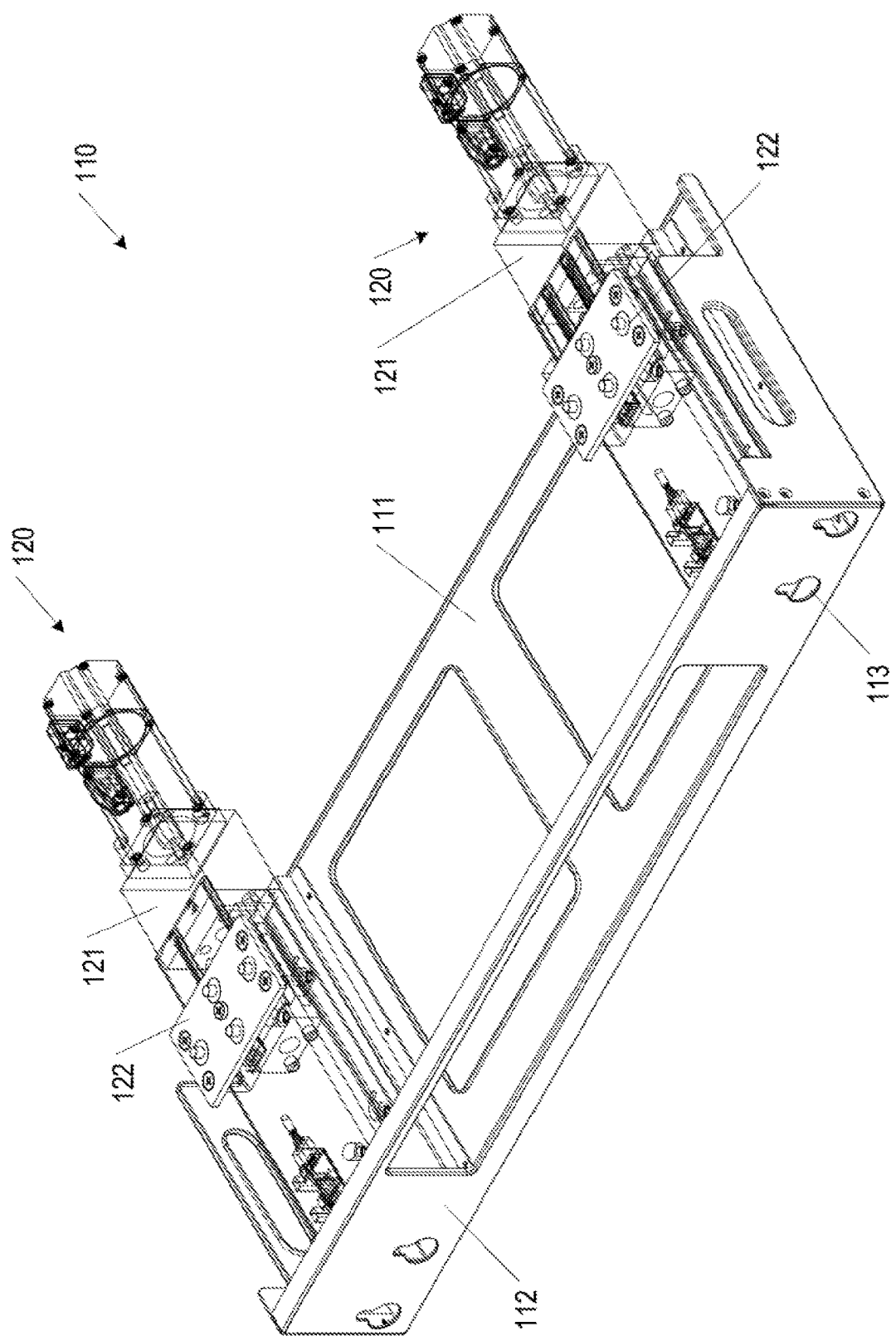
FIG. 4 illustrates a linear motion assembly of a linear motion actuation system according to one embodiment.
Figure 5:
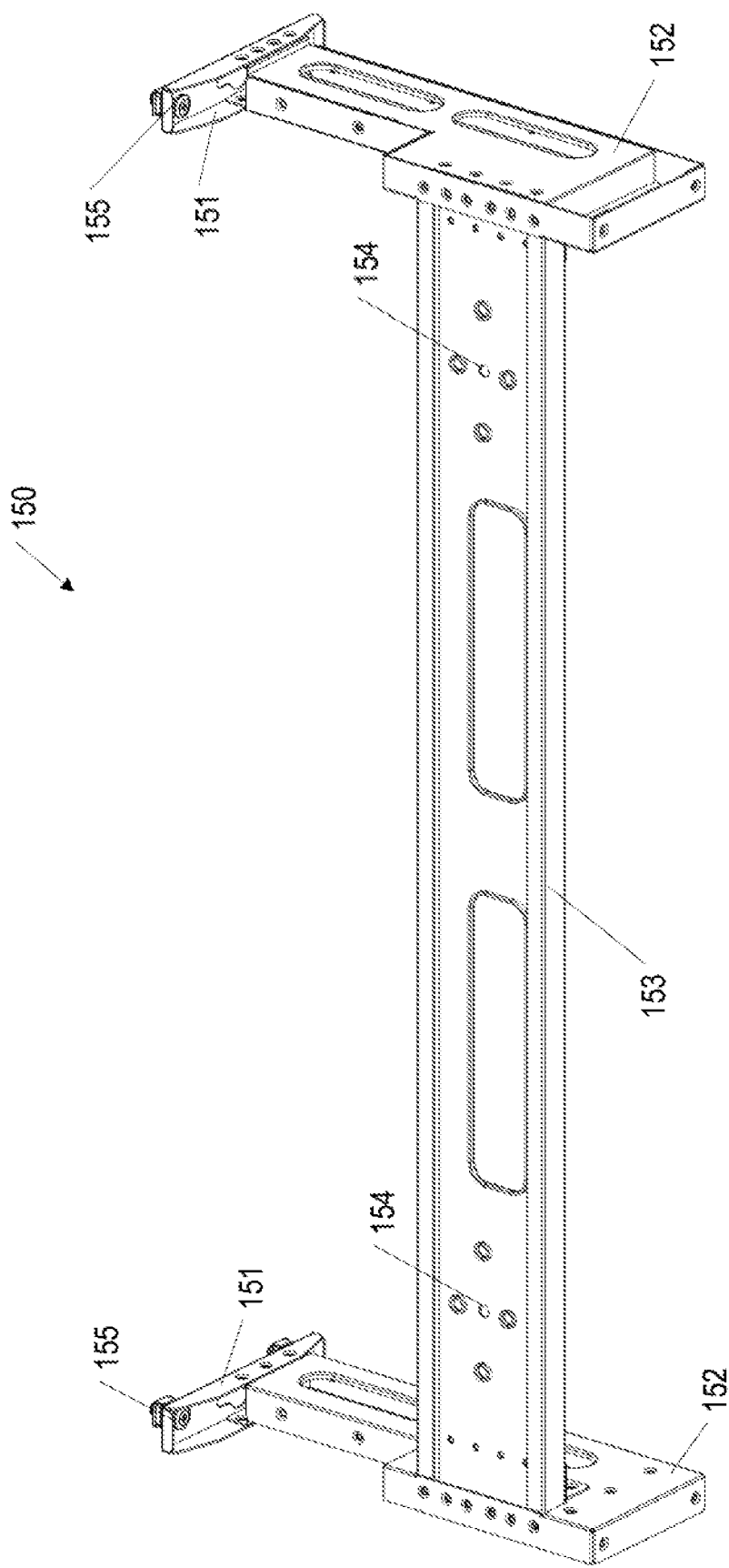
FIG. 5 illustrates a bracket of a linear motion actuation system according to one embodiment.

FIGS. 3-5 illustrate various components of the linear motion actuation system 100 according to certain embodiments. FIG. 3 specifically illustrates a complete linear motion actuation system 100, FIG. 4 illustrates a linear motion assembly 110 of the linear motion actuation system 100 (and having linear motion actuators 120 secured thereon), and FIG. 5 illustrates a bracket of the linear motion actuation system 100 in accordance with one embodiment.

As illustrated in FIGS. 3-5, the linear motion actuation system 100 comprises a linear motion assembly 110, at least one (e.g., two) linear motion actuators 120, and a bracket 150. In the illustrated embodiment, the linear motion assembly 110 is configured for movement (e.g., along a linear movement path) relative to the bracket 150, via the at least one linear motion actuators 120. For example, the linear motion assembly 110 may be configured to be secured relative to a server blade 20 (e.g., a front face 21 of the server blade) such that the linear motion assembly 110 moves with the server blade 20 relative to the server rack 11, and the bracket 150 may be configured to be secured relative to the server rack 11 and to remain at least substantially stationary with the server rack 11, while the linear motion actuator 120 utilizes the bracket 150 for leverage in applying a movement force to the linear motion assembly 110, thereby moving the server blade 20 relative to the server rack 11.

As illustrated specifically in FIG. 3, the linear motion assembly 110 comprises a frame 111 defining a base portion and a face portion 112. The frame 111 may comprise a rigid material (for example, a rigid material includes, but is not limited to, sheet metal, stainless steel, aluminum, as well titanium plate, fiberglass panels, or other materials). The face portion 112 of the illustrated embodiment is at least substantially planar, however it should be understood that the face portion 112 may have any of a variety of configurations, for example, to accommodate contours of features of a front face 21 of a server blade 20 to be installed/removed utilizing the linear motion assembly 110. Additionally or alternatively, the face portion 112 may have an at least substantially universal configuration to accommodate contours and/or features of a plurality of front face 21 of a plurality of server blades 20, and accordingly the face portion 112 of the frame 111 (and/or other portions of the frame 111) may define/comprise various features, apertures, contours, and/or the like to accommodate configurations of a plurality of server blades 20. Moreover, in the illustrated embodiment, the face portion 112 has a protective layer applied thereto, such as a protective, non-scratch plastic material configured to contact the front face 21 of the server blade 20 so as to avoid direct contact between metallic components of the linear motion actuation system 100 and the server blade 20. However, it should be understood that certain embodiments may omit such a protective layer and/or the protective layer may have any of a variety of configurations (e.g., discrete protective spacers, a protective coating, and/or the like).

Figure 6:
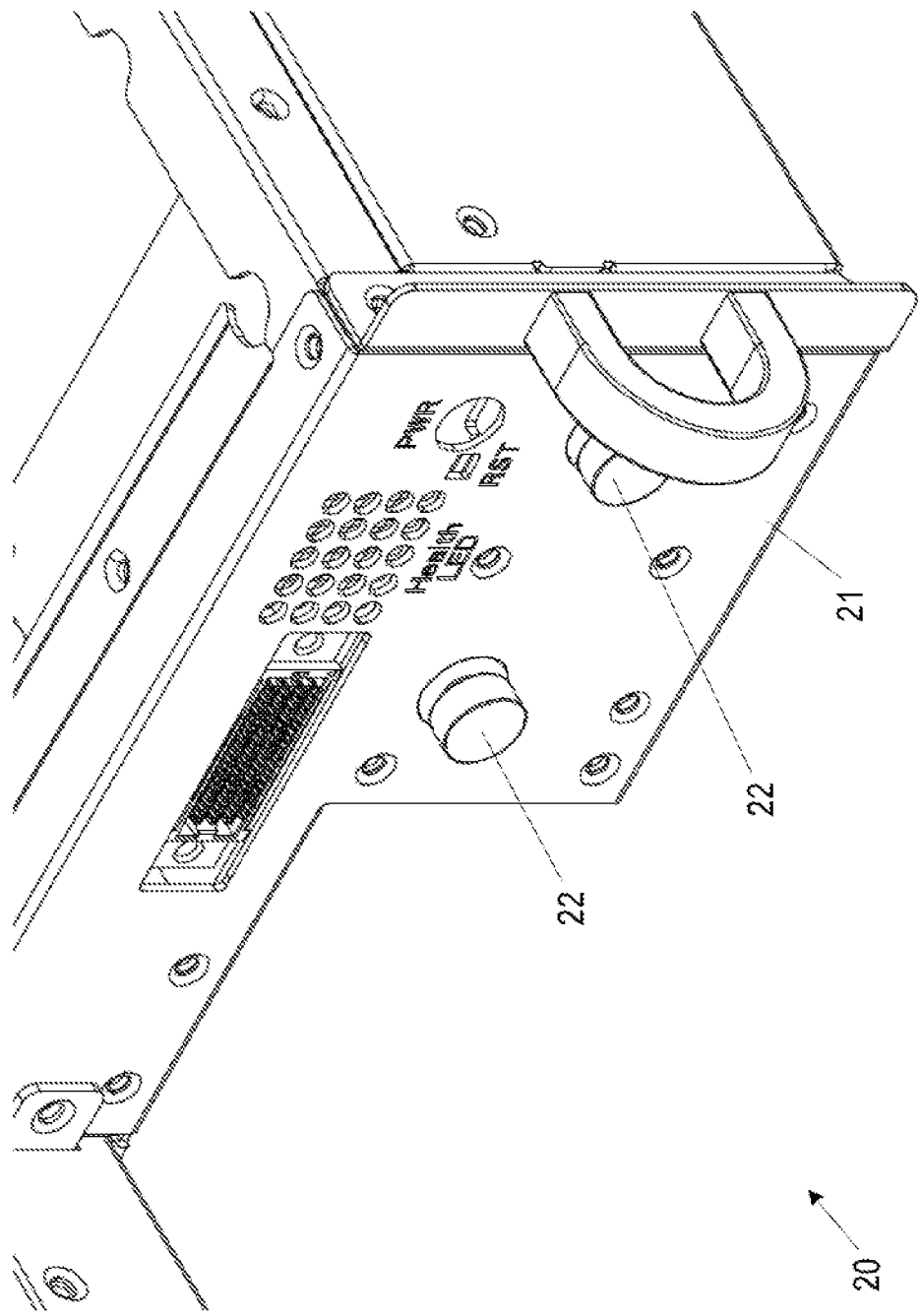
FIG. 6 illustrates a close-up view of a portion of a server blade face illustrating fasteners for securing a linear motion assembly in accordance with one embodiment.

Moreover, as shown in the illustrated embodiment of FIG. 4, the face portion 112 of the frame 111 defines one or more fastener engagement features, such as the keyhole slots 113 of the illustrated embodiment. As noted above in reference to the configuration of the server blade 20, the fastener engagement features of the linear motion assembly 110 may be embodied as any of a variety of fastener engagement feature types to accommodate a desired fastener configuration (e.g., to accommodate bolts, nuts, screws, and/or the like). Specifically, the keyhole slots 113 illustrated in FIG. 4 may be configured to engage corresponding T-head pins 22 on a front face 21 of a server blade 20, such as shown in the close-up view of a portion of a front face 21 of a server blade 20 as shown in FIG. 6.

As additionally illustrated in FIG. 4, the frame 111 may comprise one or more additional surface portions, such as side-surfaces configured to provide additional rigidity to the frame 111, for example, to support the weight of the linear motion actuators 120, to support forces generated by the linear motion actuators 120, and/or the like.

Moreover, one or more linear motion actuators 120 may be secured (e.g., rigidly secured) relative to the frame 111. In the illustrated embodiments, two linear motion actuators 120 are secured relative to the frame 111, however it should be understood that more or fewer linear motion actuators 120 may be utilized in certain embodiments. The linear motion actuators 120 may be embodied as linear-motion motors (e.g., capable of high torque outputs and/or slow travel speeds), although any of a variety of linear motion actuators 120 may be utilized, such as solenoids, and/or the like. As just one non-limiting example, the linear motion actuators 120 may be embodied as high-torque, low-speed linear motion motors (e.g., screw-drive motors) capable of outputting a linear motion force of at least approximately 220 lbf and capable of a travel speed of 1 mm/second. The linear motion actuators 120 may be indexed based on displacement, such that the linear motion actuators 120 are configured to maintain an at least substantially constant movement speed even when faced with varying loading (e.g., via appropriate feedback loop circuitry, which may be embodied at least in part within a controller 200 as discussed in greater detail herein).

One non-limiting example of linear motion actuators 120 as reflected in the illustrated embodiments comprise a housing 121 that may be rigidly secured relative to the frame 111 of the linear motion assembly 110 (e.g., via one or more fasteners). Such rigid securing of the housing 121 of the linear motion actuators 120 relative to the frame 111 causes the housing 121 to move together with the frame 111 and the remainder of the linear motion assembly 110, along with the server blade 20. The linear motion actuators 120 each additionally comprise one or more movement saddles 122 configured for linear motion relative to the housing 121. The movement saddles 122 of certain example embodiments may be controlled by 17-bit serial encoder technology having a resolution of 131,072 count/rev to maintain precise linear travel accuracy, (e.g., within a positional tolerance of 0.02 mm). At the same time, robot saddle's smooth speed control may minimize potential movement wobble that may otherwise contribute to skewing of the server blade 20 during movement.

Moreover, the one or more movement saddles 122 may be configured to be secured relative to a bracket 150 (discussed in greater detail herein), for example, via one or more fasteners (e.g., screws, pins, pin-and-cotter-pin combinations, bolts, nuts, and/or the like). In the illustrated embodiment for example, the movement saddles 122 each define a plurality of positioning pins and/or one or more female screw holes (e.g., a single female screw hole) configured to accept screws extending through corresponding throughholes of a bracket 150, to secure the bracket relative to the movement saddles 122. However, it should be understood that other configurations may be provided in certain embodiments, such as utilizing one or more screws (e.g., and a single corresponding screw hole of a movement saddle 122) or other mechanisms for securing the movement saddle 122 to bracket 150.

As just one example, the movement saddles 122 may comprise angular-to-linear movement features, for example, moveably secured with a rotational screw of the linear motion actuators 120. Accordingly, upon rotation of the included screw of the linear motion actuator 120, the movement saddles 122 move at least substantially linearly relative to the housing 121 of the linear motion actuators 120. In certain embodiments, the included movement screw may be rotated by an included angular motor (e.g., a brushed motor, a brushless motor, and/or the like) upon receipt of appropriate power signals, for example, from an included controller 200 as discussed in greater detail herein. It should be understood that any of a variety of linear motion actuators 120 may be utilized for moving the included movement saddles 122. The movement saddles 122 may also be powered by any of a variety of linear motion actuators. As additional non-limiting examples, other linear motion actuators may be embodied as linear motors, hydraulic cylinders, pneumatic cylinders, and/or the like.

As mentioned, the illustrated embodiment comprises two linear motion actuators 120 spaced apart from one another and positioned proximate opposing lateral ends of the frame 111 (and the linear motion assembly 110), such that the linear motion actuators 120 are each positioned closer to a respective edge of the frame than the center of the frame 111. Accordingly, the linear motion actuators 120 are configured to apply force relative to corresponding lateral edges of a server blade 20, so as to minimize the likelihood of the server blade 20 skewing relative to the blade slot 27 during installation and/or removal. However, it should be understood that the linear motion actuators 120 may be positioned in other configurations, such as proximate a center of a frame 111 (or a single linear motion actuator 120 may be positioned proximate a center of a frame 111, and may include or omit various gearing to apply forces to opposing edges of the frame 111 and server blade 20).

FIG. 5 illustrates a bracket 150 of a linear motion actuation system 100 in accordance with one example embodiment. As discussed above, the bracket 150 is configured to be secured relative to a server rack 11 (e.g., relative to an installation flange 15 of the server rack 11) to provide an anchor for the linear motion actuator 120 to provide leverage for providing a force to move the server blade 20 relative to the server rack 11. Thus, during operation of the linear motion actuation system 100, the bracket 150 remains at least substantially stationary, while the linear motion assembly 110 moves relative to the bracket 150 (e.g., based on a force generated by the one or more linear motion actuators between the bracket 150 and the linear motion assembly 110) to move the server blade 20 relative to the server rack 11.

With reference to FIG. 5, the bracket 150 comprises bracket arms 152 each defining a first end and a second end. The first end of each bracket arm 152 has a mounting plate 151 secured thereto (e.g., separately attached to the bracket arm 152 via one or more fasteners, welds, and/or the like, or integrally formed with the bracket arm 152). The mounting plates 151 are each configured to mount relative to a portion of the server rack 11, such as the installation flanges 15 of the server rack 11. For example, the mounting plates 151 of the bracket 150 may comprise one or more fastener engagement features, configured to engage fasteners to secure the mounting plates 151 relative to the server rack 11. As illustrated in the embodiment of FIG. 5, the fastener engagement features are embodied as keyhole slots 155 configured to slidably engage T-head pins 16 extending away from the surfaces of the installation flanges 15. However, as discussed throughout the present discussion, any of a variety of fastener configurations may be utilized, and the fastener engagement portions of the mounting plates 151 may have corresponding configurations to accommodate a desired fastener configuration (e.g., through holes to accommodate bolts or screws, and/or the like).

As additionally illustrated in FIG. 5, the bracket 150 additionally comprises a bracket body 153 extending between the bracket arms 152 and positioned proximate a second end of the bracket arms 152 (the second end being opposite the mounting plates 151 of the bracket arms 152). It should be understood that the positioning of the body 153 may be adjusted, for example, to accommodate different contours of various server blades 20 and/or to adjust the anchor position for the linear motion actuators 120. As indicated, the body may be secured relative to the bracket arms 152 (e.g., via one or more fasteners that may be positionally adjusted, for example, into a plurality of discrete mounting holes, so as to adjust the relative positioning of the body 153 relative to the bracket arms 152). Moreover, the body may define one or more fastener engagement features configured to be secured relative to the movement saddles 122 of the linear motion actuators 120, as discussed herein. As specifically illustrated in FIG. 5, the fastener engagement features of the body 153 may be defined as throughholes 154 configured to accept a screw extending into a corresponding threaded hole within the movement saddle 122. In certain embodiments, the fastener engagement features may encompass a single throughhole (to enable a screw to extend through the throughhole 154 to engage a corresponding single threaded hole of a movement saddle 122, as shown in FIG. 3) or a plurality of throughholes (to engage a corresponding plurality of threaded holes of a corresponding movement saddle 122). The bracket 150 may thus be rigidly secured relative to the movement saddles 122, such that movement of the movement saddles 122 relative to the housing 121 of the one or more linear motion actuators 120 utilizes the bracket 150 as an anchor against which the linear motion actuators 120 push (or pull) to move the linear motion assembly 110 relative to the bracket 150 to move the server blade 20 relative to the server rack 11 (e.g., into the server rack 11 during installation or out of the server rack 11 during removal).

Each of the bracket arms 152, mounting plates 151, and the body 153 of the illustrated embodiment comprise a rigid material, such as a metal material (e.g. sheet metal, stainless steel, aluminum, titanium plate, and/or the like), as well as but not limited to non-metal materials (e.g. fiberglass panel, and/or the like) configured to withstand deformation forces at least as strong as may be applied by the one or more linear motion actuators 120.

Controller

As discussed herein, the operation of the one or more linear motion actuators 120 may be controlled via a controller 200 in electronic connection with each of the one or more linear motion actuators 120. In certain embodiments, the electronic connection between the one or more linear motion actuators 120 and the controller 200 may be configured for two-way communication, for example, for transmitting control signals from the controller 200 to the one or more linear motion actuators 120 and for receiving feedback signals from the one or more linear motion actuators 120 to the controller 200, for example, to enable adjustment of one or more control signals provided to the one or more linear motion actuators 120.

Figure 7C:
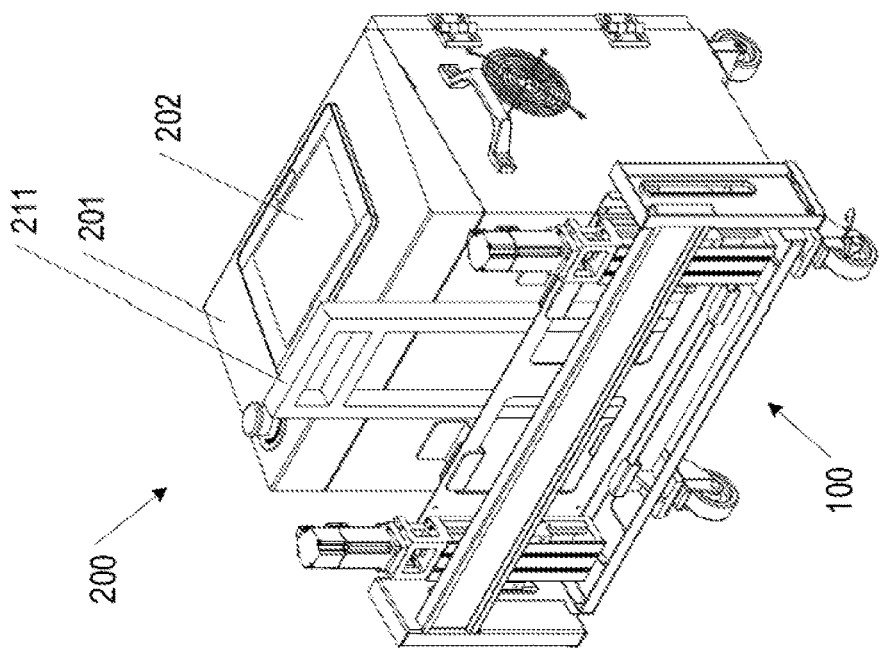
FIGS. 7A-7C illustrate a controller of a linear motion actuation system in accordance with one embodiment.
Figure 7B:
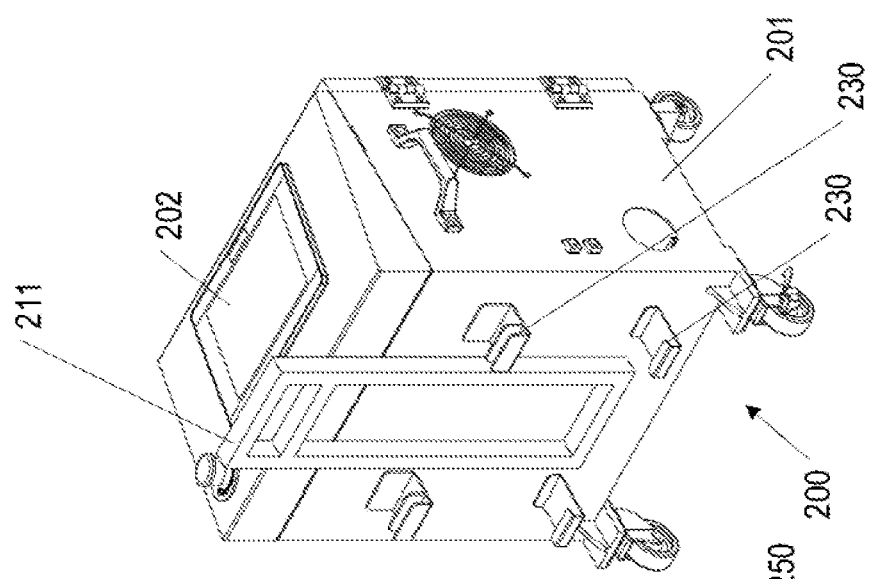
Figure 7A:
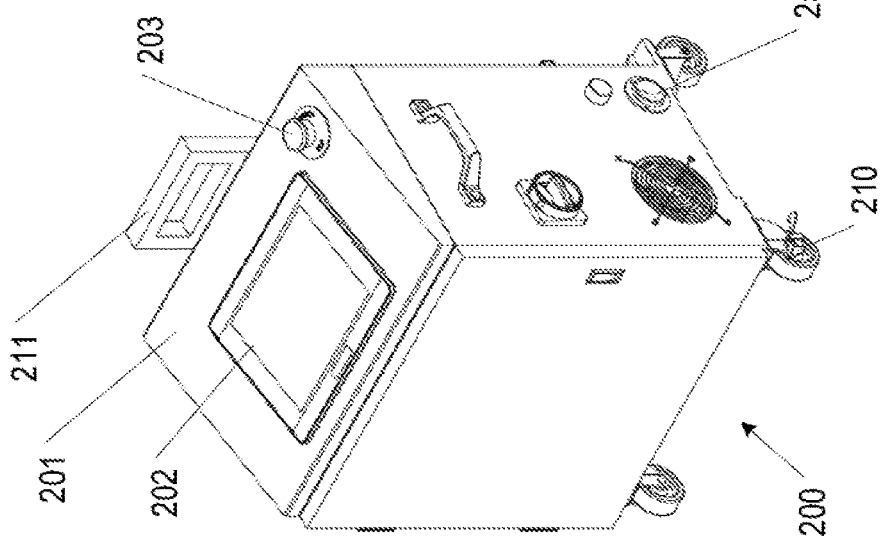
Figure 8:
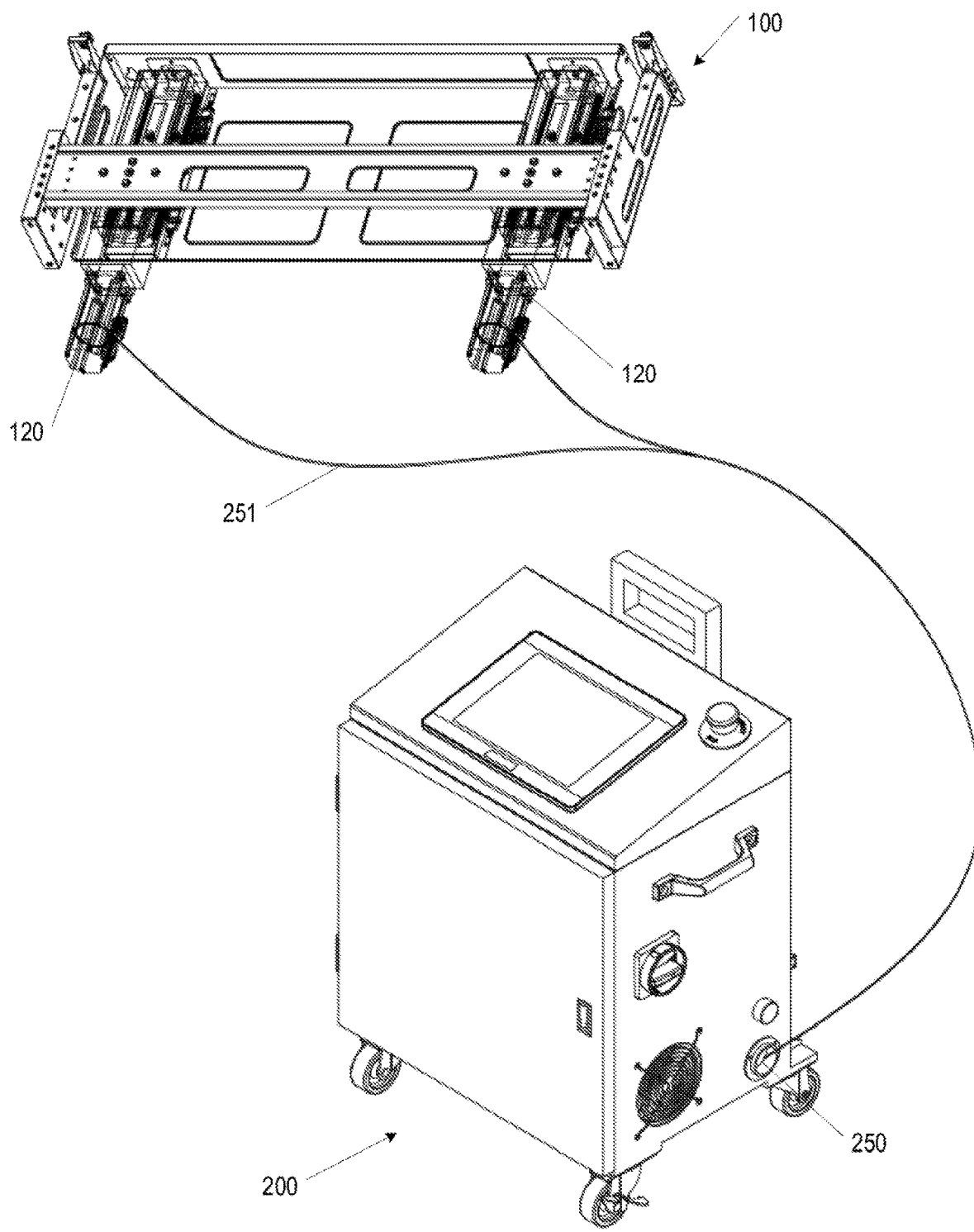
FIG. 8 illustrates the electrical connectivity of the controller relative to a linear motion actuation system in accordance with one embodiment.

FIGS. 7A-7C illustrate an example embodiment of a controller 200 in accordance with one embodiment, and FIG. 8 schematically illustrates an electronic connection between the controller 200 and the one or more linear motion actuators 120 in accordance with one embodiment, via conductors 251.

As illustrated in FIGS. 7A-7C, the controller 200 may comprise a controller housing 201 configured for supporting and protecting various electronic control modules therein. For example, the controller housing 201 may house a control module corresponding to each of the one or more linear motion actuators 120, and a master control module configured for maintaining consistency of movement between the one or more linear motion actuators 120 (e.g., monitoring relative displacement of the linear motion actuators 120 to ensure the difference is position of each of the linear motion actuators 120 is within a maximum off-sync range) as discussed herein.

In various embodiments the controller 200 may have an onboard power supply and/or may receive electric power from an outside power source (e.g., a wall outlet, such as a 120V wall outlet, a 240V wall outlet, and/or the like). The onboard power supply may comprise a power converter, such as to convert received AC power from an outside power source to DC power to be utilized in control signals provided to the one or more linear motion actuators 120. The onboard power supply may be configured to supply electrical power to the one or more onboard controllers, which may pass electrical control signals to the one or more linear motion actuators 120 in accordance with various embodiments.

Although not shown, the controller may additionally comprise one or more onboard cooling mechanisms (e.g., air-cooling systems, liquid cooling systems, and/or the like) including one or more housing fans and/or other cooling mechanisms.

The controller 200 may additionally comprise an onboard user interface 202 configured for displaying data indicative of the current operation of the one or more linear motion actuators 120. The user interface 202 may comprise one or more user input elements (e.g., separate buttons or the user interface 202 may be configured as a touch-screen device configured to receive user input) so as to receive user input to initiate movement of the one or more linear motion actuators 120.

As illustrated in FIGS. 7A-7C, the controller housing 201 may additionally comprise one or more features and/or components to facilitate movement of the controller 200, such as wheels 210, carry handles, and/or a pulling handle 211 (e.g., an extendable pulling handle 211 that may be adjustable in length to accommodate a user). Moreover, as shown in FIG. 7B-7C, the controller housing 201 may additionally comprise one or more hanger elements 230 configured to support components of the linear motion actuation system 100 thereon (e.g., specifically, the linear motion assembly 110 and/or bracket 150 (and linear motion actuators 120). Such a configuration facilitates movement of the entire controller 200 and remaining portions of the linear motion actuation system 100, for example, between server cabinets 10 during an extended server blade 20 installation job.

Method of Use

FIGS. 9-13 provide various illustrations and flowcharts indicating the installation and use of a linear motion actuation system 100 for moving a server blade 20 relative to a server rack 11.

Figure 9:
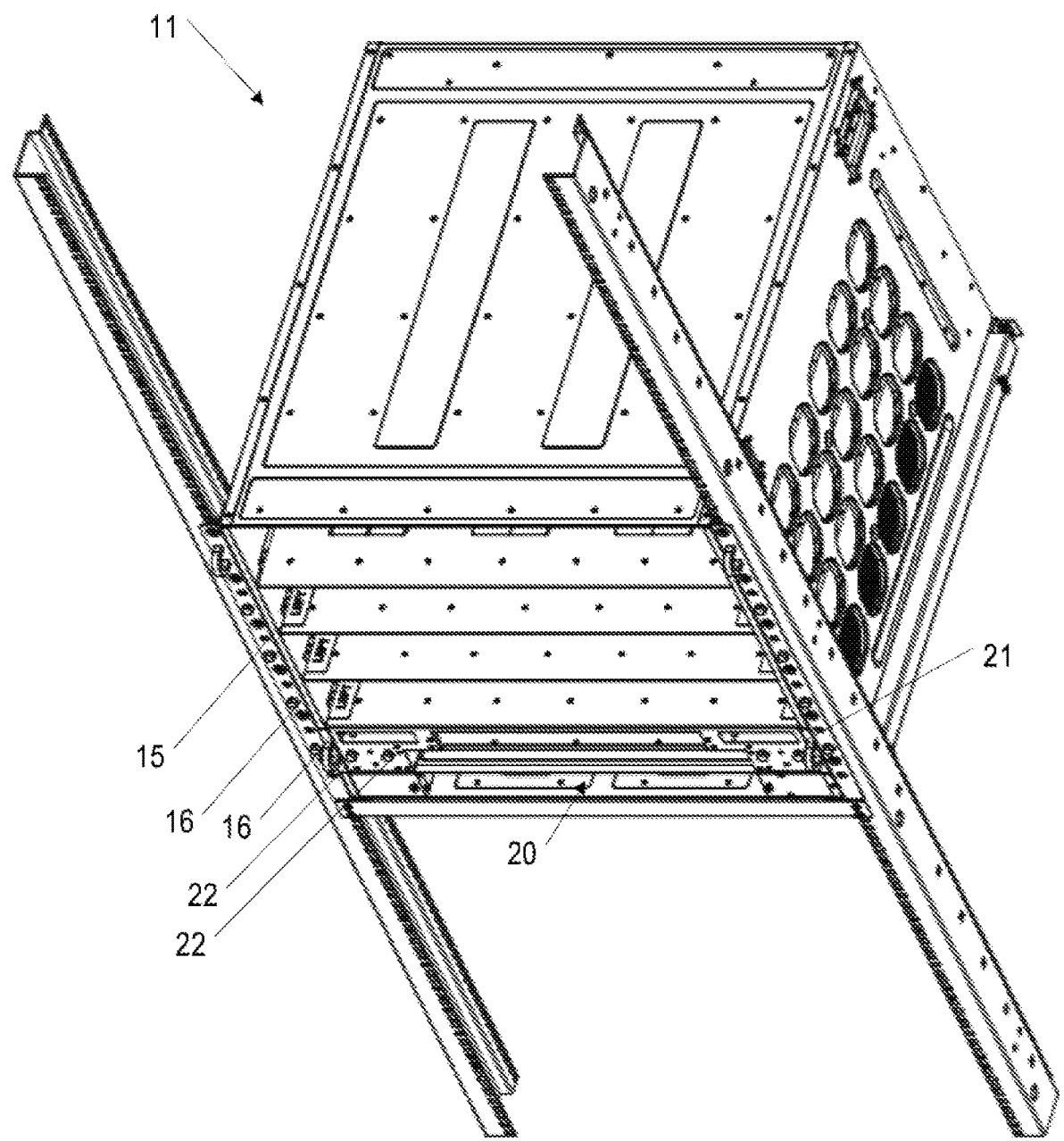
Figure 13:
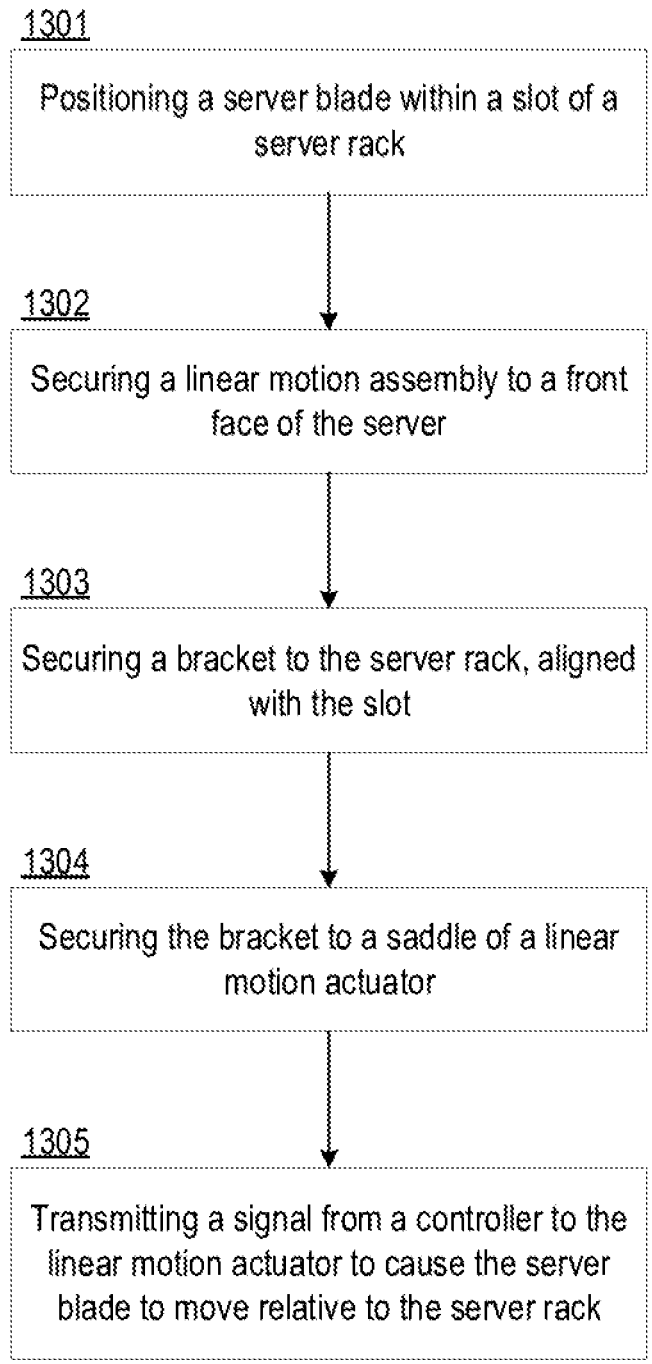
FIG. 13 illustrates a flowchart for utilizing a linear motion actuation system for moving a server blade relative to a server rack in accordance with one embodiment.

As illustrated in FIG. 9 and as reflected at Block 1301 of FIG. 13, a server blade 20 to be installed within a server rack 11 is positioned within a blade slot 17 within which the server blade 20 is to be installed. Initial placement may be performed by hand, with the server blade 20 being slid into the blade slot 17, without engaging pins with connector arrays 13 of the back plane 12 at the back of the blade slot 17.

Figure 10:
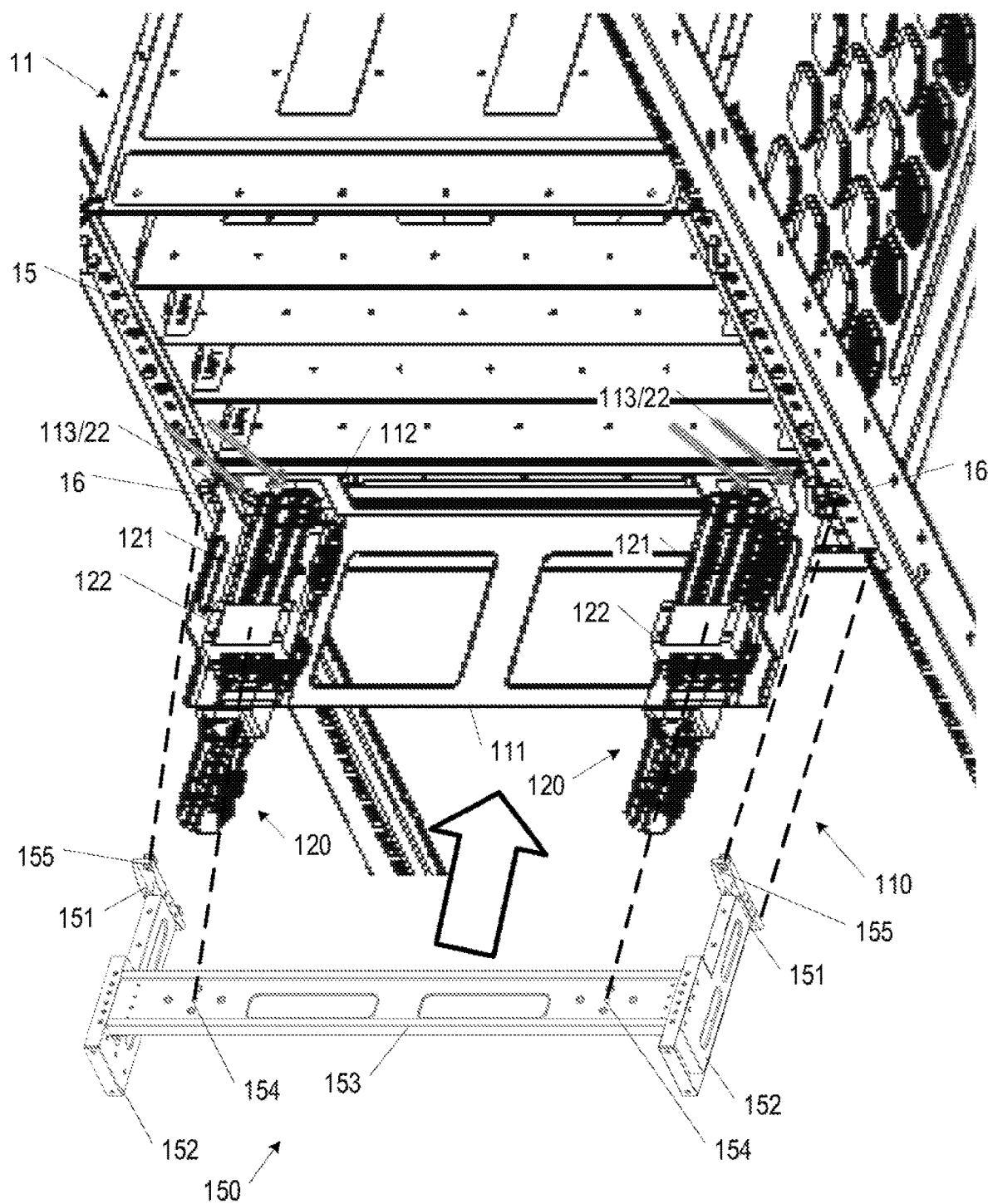

With reference to FIG. 10 and Block 1302 of FIG. 13, the linear motion assembly 110 is secured relative to the front face 21 of the server blade 20. As mentioned above, the linear motion assembly 110 comprises a frame 111 defining a face portion 112 having fastener engagement features defined therein for engaging the linear motion assembly 110 relative to the front face 21 of the server blade 20. In the specific embodiments of the figures, the face portion 112 defines a plurality of keyhole slots 113 each configured to slidably engage a corresponding T-head pin 22 extending away from the front face 21 of the server blade 20. The linear motion assembly 110 may be hung from the T-head pins 22 of the server blade 20, without additional support or fasteners. These T-head pins 22 are configured to enable pushing forces to be applied against the front face 21 of the server blade 20 (e.g., by enabling the face portion 112 to directly apply a force to the front face 21 of the server blade 20) and to enable pulling forces to be applied against the front face 21 of the server blade 20 (e.g., by enabling the face portion 112 to apply a pulling force to a back-side of each of the T-head pins 22, which are securely connected with the server blade 20). As mentioned herein, other fastener configurations may be utilized in other configurations enabling similar transmission of push and pull forces between the linear motion actuation system 100 and the server blade 20.

Figure 11:
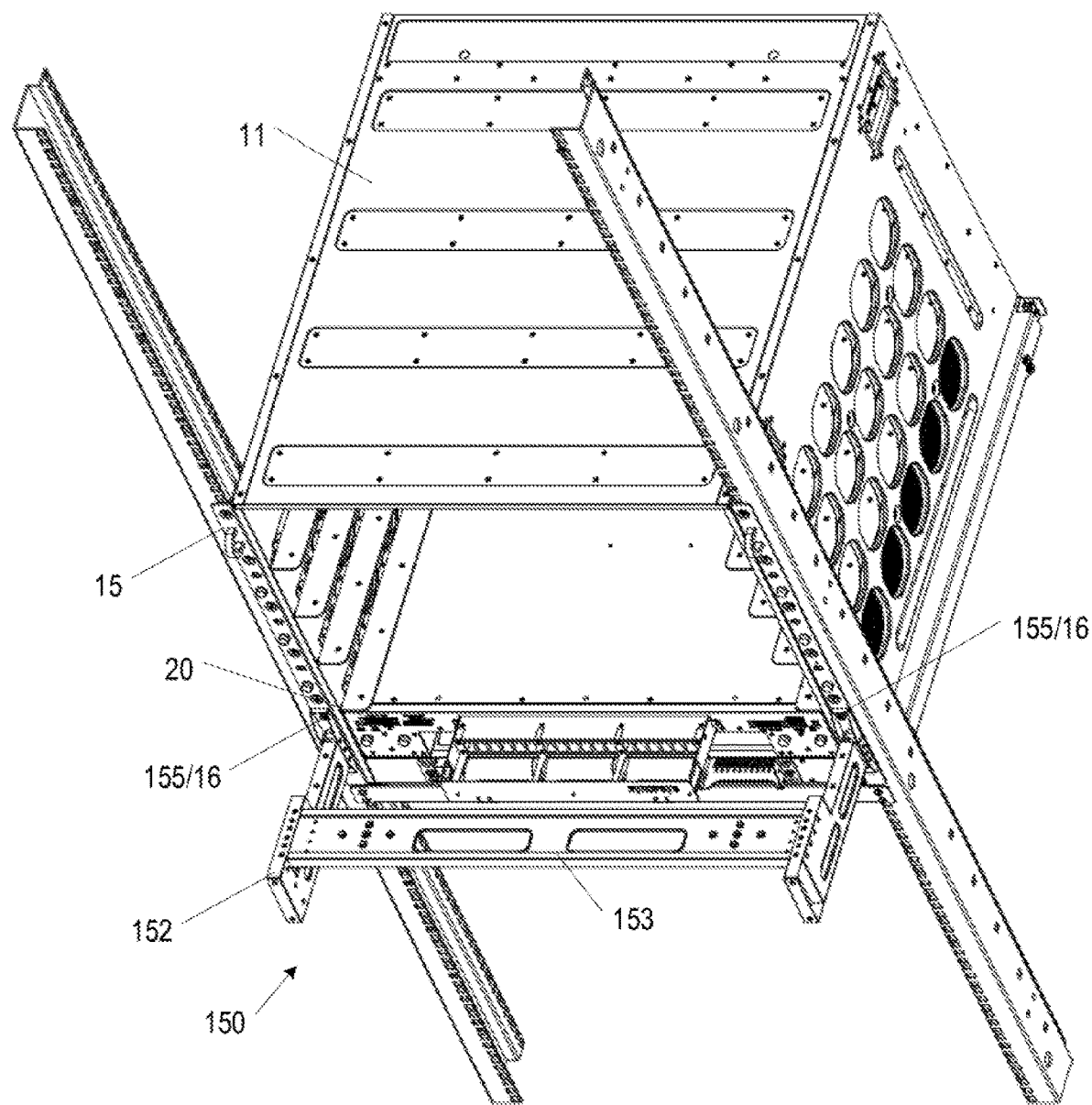

With reference to FIG. 10 and FIG. 11 (which illustrates the bracket mounted relative to the server rack 11 without inclusion of the linear motion assembly 110 to more clearly illustrate the installation of the bracket 150), and with reference to Block 1303 of FIG. 13, the bracket 150 may be secured relative to the server rack 11, in alignment with the blade slot 17 into which the server blade 20 is being installed (or removed). The bracket 150 may be installed by securing the mounting plates 151 of the bracket 150 (via integrated fastener engagement features) to the server rack 11 (e.g., the installation flanges 15 of the server rack 11). Specifically with reference to the illustrated embodiments, the mounting plates 151 each define a plurality of keyholes 155 each configured to slidably engage a corresponding T-head pin 16 extending away from the installation flange 15 of the server rack 11. The bracket 150 may be hung from the T-head pins 16 of the server rack 11, without additional support or fasteners. These T-head pins 16 are configured to enable pushing forces to be applied against the server rack 11 (e.g., by enabling the mounting plates 151 to directly apply a force to the installation flanges 15 of the server rack 11) and to enable pulling forces to be applied against the server rack 11 (e.g., by enabling the mounting plates 151 to apply a pulling force to a back-side of each of the T-head pins 16, which are securely connected with installation flanges 15). As mentioned herein, other fastener configurations may be utilized in other configurations enabling similar transmission of push and pull forces between the bracket 150 and the server rack 11.

Figure 12B:
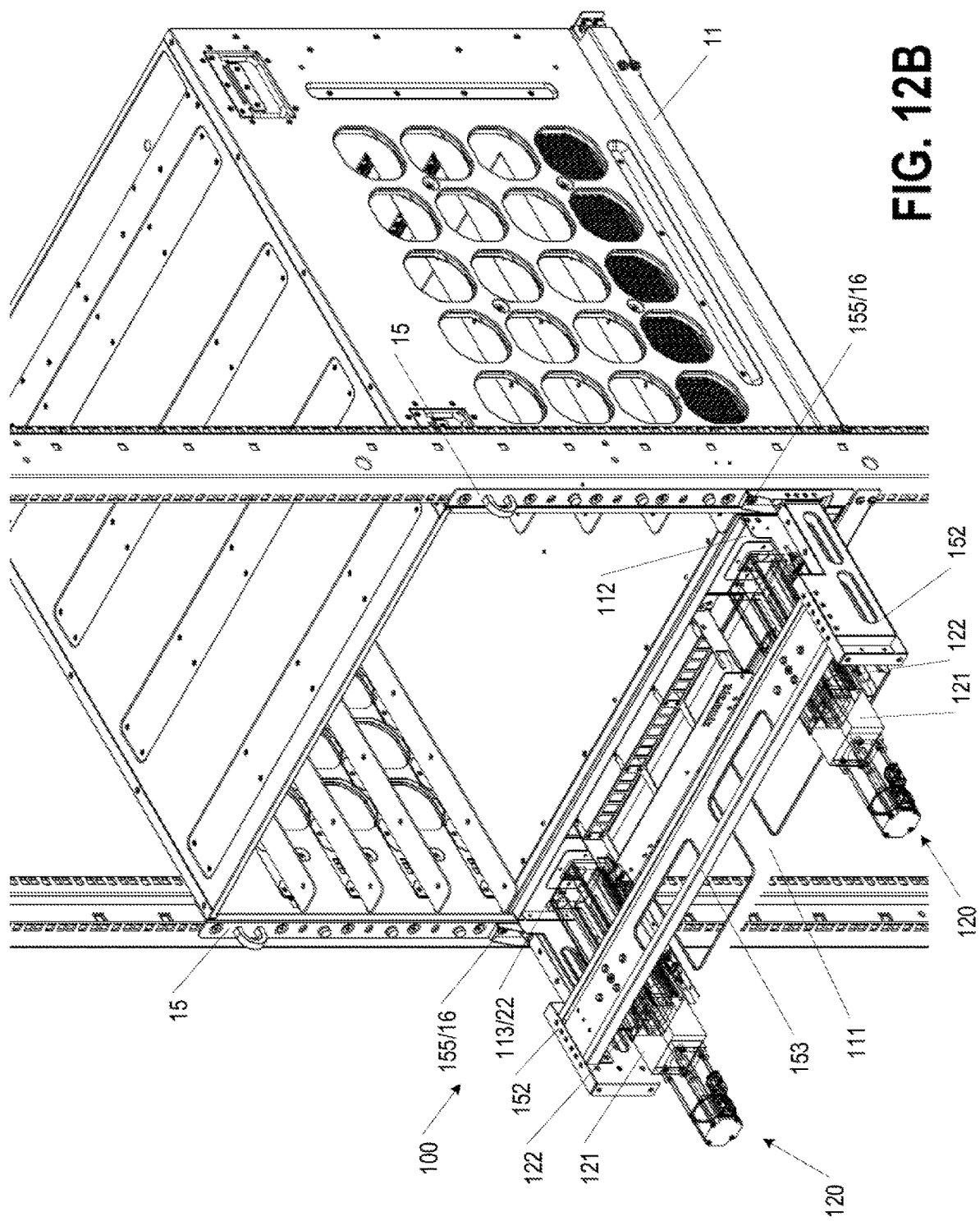

With reference to FIGS. 12A-12B and Block 1304 of FIG. 13, the bracket 150 is secured relative to the movement saddles 122 of the one or more linear motion actuators 120. Because the linear motion assembly 110 (having the one or more linear motion actuators 120 secured thereto) is secured relative to the server blade 20, the throughholes 154 of the bracket 150 may be aligned with corresponding mounting holes (or other fastener components) of the movement saddles 122 by manually adjusting the positioning of the server blade 20 (and the linear motion assembly 110) until alignment. If applicable (such as in the illustrated embodiments) fasteners (e.g., screws) may be used to secure the bracket 150 relative to the movement saddles 122.

Once the bracket 150 is secured relative to the movement saddles 122, the one or more linear motion actuators 120 may be utilized to move the server blade 20 relative to the server rack 11. As indicated in Block 1305 of FIG. 13, the controller 200 may generate and transmit appropriate control signals to the one or more linear motion actuators 120 (e.g., in response to receipt of corresponding user input) to initiate movement of the server blade 20 relative to the server rack 11, such as to move the server blade 20 into the server rack 11 during an installation procedure to engage pins with corresponding connector arrays 13 of the back plane 12, or to move the server blade 20 out of the server rack 11 during a removal procedure to disengage pins from corresponding connector arrays of the back plane 12.

Once the server blade 20 installed or removed from the server rack 11 (as desired), the linear motion actuation system 100 may be removed by reversing the installation procedure discussed above. First, the fasteners connecting the bracket 150 with the movement saddles 122 may be removed, thereby decoupling the bracket 150 from the movement saddles 122. The bracket 150 may then be removed from the server rack 11 by decoupling the corresponding fasteners (e.g., by lifting the keyholes 155 and decoupling the keyholes 155 of the mounting plates 151 from the T-head pins 16 of the installation flanges 15). The linear motion assembly 110 may then be removed from the server blade 20 by decoupling corresponding fasteners (e.g., by lifting the keyhole slots 113 and decoupling the keyhole slots 113 of the frame 111 from the T-head pins 22 of the front face 21 of the server blade 20).

Controller Operation

Figure 14:
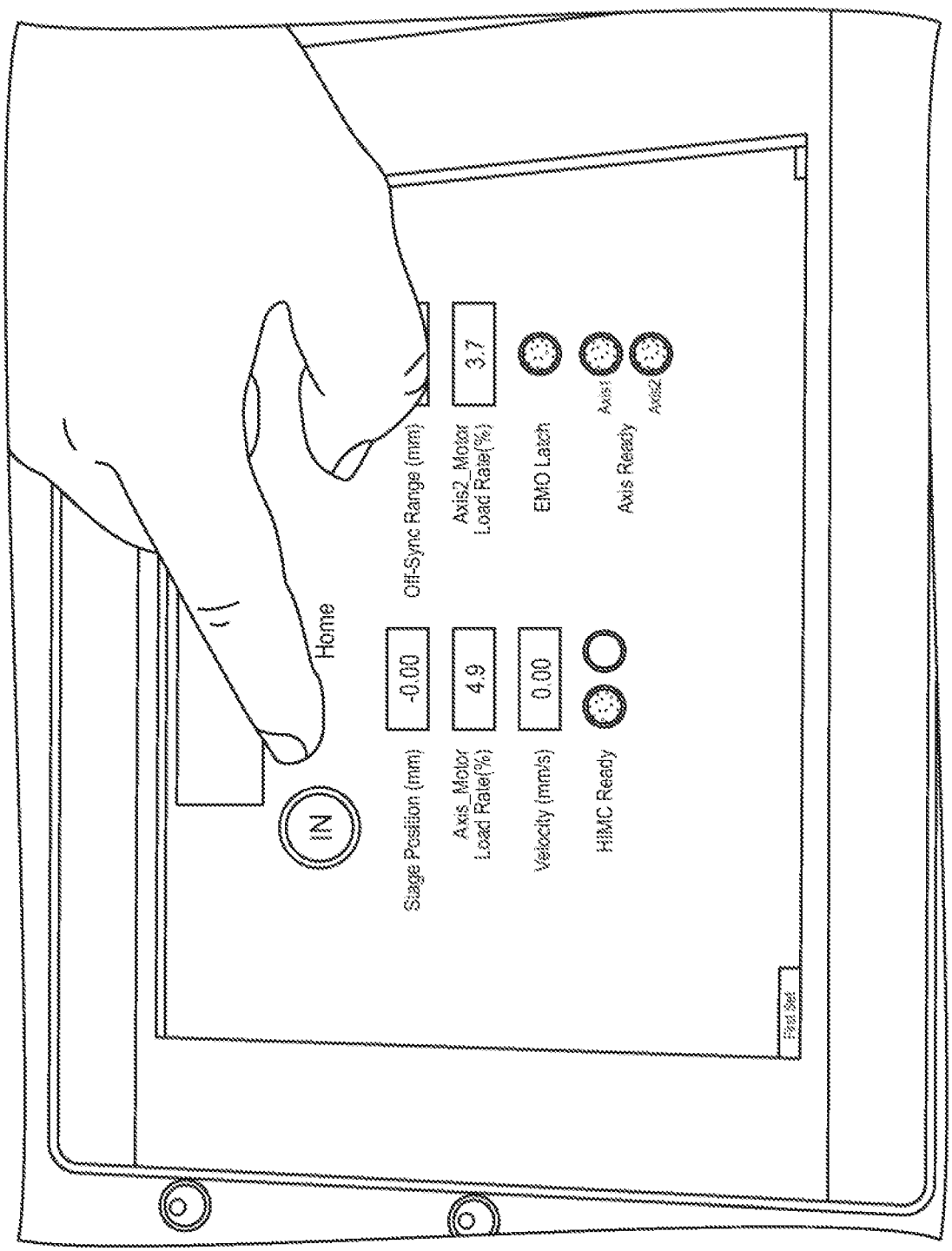
FIGS. 14-15 are example user interfaces that may be provided via a controller in accordance with certain embodiments.
Figure 15:
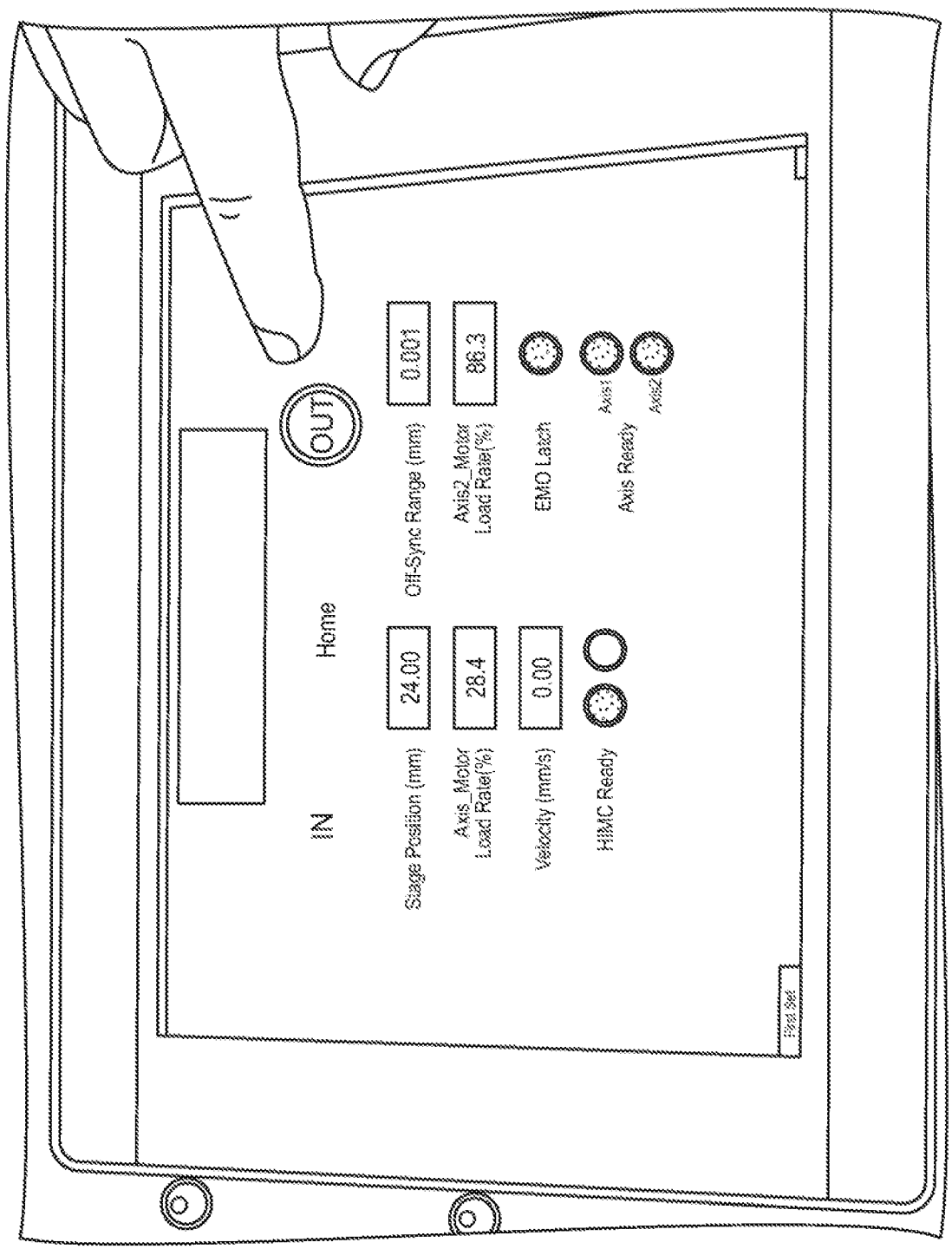

FIGS. 14-15 illustrate example graphical user interfaces (GUIs) that may be displayed via the user interface 202 of the controller 200. The controller 200 functionality may be limited based at least in part on the positioning of the one or more linear motion actuators 120. For example, when the one or more linear motion actuators 120 are in an extended position (corresponding to pushing a server blade 20 into a server rack 11), the controller 200 may only permit functionality to retract the one or more linear motion actuators 120 (corresponding to moving a server blade 20 out of a server rack 11). Accordingly, the GUIs may correspond to the limited functionality permitted by the controller 200. In the examples shown, FIG. 14 illustrates a GUI that may be displayed while the one or more linear motion actuators 120 are in a retracted position (corresponding to the server blade 20 being in an uninstalled position). The displayed GUI illustrates the "IN" functionality as a pressable button (e.g., a pressable GUI element on a touch-screen device), thereby enabling the controller 200 to receive user input requesting initiation of an installation functionality to extend the one or more linear motion actuators 120 to install a server blade 20 into a server rack 11. The "OUT" user interface element is not indicated as a pressable button, and accordingly the GUI is not configured to accept user input to initiate a removal procedure in the configuration reflected in FIG. 14. FIG. 15 illustrates a GUI that may be displayed while the one or more linear motion actuators 120 are in an extended position (corresponding to the server blade 20 being in an installed position). The displayed GUI illustrates the "OUT" functionality as a pressable button (e.g., a pressable GUI element on a touch-screen device), thereby enabling the controller 200 to receive user input requesting initiation of a removal functionality to retract the one or more linear motion actuators 120 to remove a server blade 20 from a server rack 11. The "IN" user interface element is not indicated as a pressable button, and accordingly the GUI is not configured to accept user input to initiate an installation procedure in the configuration reflected in FIG. 15. Moreover, in various embodiments, the controller 200 is configured to disable all user interface elements during execution of a desired command. For example, while the one or more linear motion actuators 120 are moving (e.g., in response to an "IN" command or an "OUT" command), the controller 200 may disable all other GUI elements. However, the controller 200 may additionally include one or more emergency stop switches 203 to depower the system at any time (even during movement of the one or more linear motion actuators 120).

As illustrated in FIGS. 14-15, the controller 200 may be configured to store and/or output additional data regarding the functionality of the one or more linear motion actuators 120, such as illustrating a position of each of the one or more linear motion actuators 120, an indication of loading on each of the one or more linear motion actuators 120, a movement speed of each of the one or more linear motion actuators 120, an off-sync range measurement (indicative of a difference in linear positioning of the linear motion actuators 120, for embodiments comprising at least two linear motion actuators, such that the controller 200 may ensure that the linear motion actuators 120 are moving at least substantially parallel and equal in distance and/or speed), and/or the like. In certain embodiments, the included linear motion actuators 120 may have a low positioning error tolerance (e.g., the precision of each linear motion actuator 120 may be within 0.02 mm), such that the linear motion actuators 120 minimize the skew movement of the server blade 20 during an installation or removal process into/from the server rack 11. For example, in embodiments in which the one or more linear motion actuators 120 are embodied as two linear motion actuators 120 positioned 21 inches apart (corresponding to positions of the two linear motion actuators 120 on opposing ends of the frame 111 of the linear motion assembly 110) and having a tolerance of 0.02 mm in linear motion positioning, a maximum skew angle of the server blade 20 during installation via the linear motion actuation system 100 may be 0.0021 degrees.

Movement of the one or more linear motion actuators 120 in accordance with an "IN" functionality (e.g., an install functionality in which the one or more linear motion actuators 120 move to an extended position) or an "OUT" functionality (e.g., a removal functionality in which the one or more linear motion actuators 120 move to a retracted position) may comprise movement of the one or more linear motion actuators 120 may be a set distance (e.g., a set distance that may be manually set by user input in an applicable GUI). In certain embodiments, the "IN" and the "OUT" functionalities may be characterized by identical travel distances in opposite directions, such that sequential initiation of the "IN" and "OUT" functionalities (or vice versa) results in movement between a set "installed" position and a set "uninstalled" position for the linear motion actuators 120.

The controller 200, together with the one or more linear motion actuators 120, may provide a plurality of safety functionalities in certain embodiments. For example, use of the linear motion actuation system 100 may be limited to registered users having log-in credentials (e.g., a user name and password that may be entered via a corresponding GUI of the controller) that may be required for obtaining access to the functionality of the linear motion actuation system 100. Moreover, the controller 200, together with the one or more linear motion actuators 120, may monitor the amount of loading on the linear motion actuators 120 (e.g., via appropriate feedback loops), and to ensure that the loading does not exceed a determined maximum loading. Moreover, through similar feedback loops, the controller 200 and/or the one or more linear motion actuators 120 may be configured to maintain a desired constant movement speed, regardless of experienced loading, so as to ensure that the one server blade 20 is installed/removed at a carefully controlled rate by the linear motion actuation system. It should be understood that in certain embodiments, the set velocity of the linear motion actuation system 100 may be adjusted (e.g., via manual input provided to a corresponding GUI). Similarly, maximum off-sync measurements, maximum axial loading measurements, and/or the like may be adjusted via manual user input provided to a corresponding GUI. It should be understood that the off-sync measurements (as well as other potential positional measurements) may be determined by internal feedback provided by the linear motion actuators 120 and/or various external position sensors (e.g., optical position sensors) connected proximate the one or more linear motion actuators 120 according to certain embodiments.

In various embodiments, the controller 200 may be configured to execute a calibration process, during which the one or more linear motion actuators 120 are moved to a known home position to maintain desired consistency between movements of the linear motion actuators 120.

Conclusion

Many modifications and other embodiments will come to mind to one skilled in the art to which this disclosure pertains having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A linear motion actuation system for moving a server blade within a server rack, the system comprising:
    a controller;
    a linear motion assembly comprising a frame and configured for fastening relative to a server blade and configured for linear motion with the server blade, the linear motion assembly configured to accommodate at least a portion of the server blade within the frame;
    a bracket configured for fastening relative to the server rack; and
    at least one linear motion actuator comprising:
        a first component secured with the linear motion assembly; and
        a second component movably secured with the first component and secured with the bracket, wherein the second component is configured for at least substantially linear movement relative to the first component;
        wherein the at least one linear motion actuator is configured to, upon receipt of a signal from the controller, move the second component in an at least substantially linear direction relative to the first component to move the server blade relative to the server rack.

2. The linear motion actuation system of claim 1, wherein the first component of the at least one linear motion actuator is embodied as a linear motion motor.

3. The linear motion actuation system of claim 2, wherein the second component of the at least one linear motion actuator is embodied as a movement saddle rigidly secured with the bracket.

4. The linear motion actuation system of claim 1, wherein the linear motion assembly is configured to engage at least one fastener to rigidly secure the linear motion assembly relative to the server blade.

5. The linear motion actuation system of claim 4, wherein the linear motion assembly is configured to engage at least one fastener to rigidly secure the linear motion assembly relative to a front face of the server blade.

6. The linear motion actuation system of claim 4, wherein the at least one fastener comprises a T-head pin configured for slidable engagement with a keyhole within a surface of the linear motion assembly.

7. The linear motion actuation system of claim 1, wherein the bracket is configured to engage at least one fastener to rigidly secure the bracket relative to the server rack.

8. The linear motion actuation system of claim 7, wherein the at least one fastener comprises a T-head pin configured for slidable engagement with a keyhole within a surface of the bracket.

9. The linear motion actuation system of claim 1, wherein the at least one linear motion actuation comprises at least two linear motion actuators.

10. The linear motion actuation system of claim 9, wherein the controller is configured to monitor feedback indicative of a position of each of the at least two linear motion actuators to maintain at least a substantially parallel orientation relative to each other and a substantially equal distance traveled by each of the at least two linear motion actuators.

11. The linear motion actuation system of claim 10, wherein the controller stores a maximum off-sync range, and wherein the controller is configured to generate a signal to stop motion of the at least two linear motion actuators upon detecting the position of each of the at least two linear motion actuators results in a position difference exceeding the maximum off-sync range.

12. The linear motion actuation system of claim 1, wherein the controller is configured to:
    generate a first signal to move the second component in a first at least substantially linear direction relative to the first component; and generate a second signal to move the second component in a second at least substantially linear direction relative to the first component, wherein the second direction is at least substantially opposite the first direction.

13. The linear motion actuation system of claim 1, wherein the second component is configured to be fastened relative to the bracket via one or more screws.

14. A method for moving a server blade within a server rack, the method comprising:

securing a linear motion assembly relative to a server blade, wherein the linear motion assembly comprises a frame and is configured to accommodate the server blade within the frame, and is configured for linear motion with the server blade, and wherein the linear motion assembly is secured relative to at least one linear motion actuator comprising a first component rigidly secured relative to the linear motion assembly and a second component moveably secured with the first component and configured for at least substantially linear movement relative to the first component;

securing a bracket relative to a server rack;

rigidly securing the bracket relative to the second component of the at least one linear motion actuator; and transmitting a signal from a controller to the linear motion actuator to cause the second component to move at least substantially linearly relative to the first component and to move the server blade relative to the server rack.

15. The method for moving a server blade within a server rack of claim 14, wherein securing a linear motion assembly relative to a server blade comprises securing a linear motion assembly relative to a front face of the server blade.

16. The method for moving a server blade within a server rack of claim 14, wherein the linear motion actuator comprise the first component embodied as a linear motion actuator housing and the second component embodied as a movement saddle moveable relative to the linear motion actuator housing, and wherein rigidly securing the bracket relative to the second component comprises fastening the bracket relative to the movement saddle.

17. The method for moving a server blade within a server rack of claim 14, wherein the at least one linear motion actuator comprises at least two linear motion actuators, and wherein securing the bracket relative to the second component of the at least one linear motion actuator comprises securing the bracket relative to each of the at least two linear motion actuators.

18. The method for moving a server blade within a server rack of claim 17, further comprising, monitoring, via the controller, feedback indicative of a position of each of the at least two linear motion actuators to maintain at least a substantially parallel orientation relative to each other and a substantially equal distance traveled by each of the at least two linear motion actuators.

19. The method for moving a server blade within a server rack of claim 18, further comprising:

storing, via the controller, a maximum off-sync range; and generating a signal to stop motion of the at least two linear motion actuators upon detecting the position of each of the at least two linear motion actuators results in a position difference exceeding the maximum off-sync range.

20. The method for moving a server blade within a server rack of claim 14, further comprising:

generating, via the controller, a first signal to move the second component in a first at least substantially linear direction relative to the first component; and generating, via the controller, a second signal to move the second component in a second at least substantially linear direction relative to the first component, wherein the second direction is at least substantially opposite the first direction.

* * * * *